United States Patent
Shin et al.

(10) Patent No.: US 11,388,712 B2
(45) Date of Patent: Jul. 12, 2022

(54) METHOD AND APPARATUS FOR AUTOMATIC GAIN CONTROL IN VEHICLE-TO-EVERYTHING SYSTEM

(71) Applicant: Samsung Electronics Co., Ltd., Gyeonggi-do (KR)

(72) Inventors: Cheolkyu Shin, Gyeonggi-do (KR); Jeongho Yeo, Gyeonggi-do (KR); Hyunseok Ryu, Gyeonggi-do (KR); Jinyoung Oh, Gyeonggi-do (KR)

(73) Assignee: Samsung Electronics Co., Ltd

( * ) Notice: Subject to any disclaimer, the term of this patent is extended or adjusted under 35 U.S.C. 154(b) by 83 days.

(21) Appl. No.: 16/673,349

(22) Filed: Nov. 4, 2019

(65) Prior Publication Data

US 2020/0146000 A1    May 7, 2020

(30) Foreign Application Priority Data

Nov. 2, 2018  (KR) .......................... 10-2018-0133629
Aug. 14, 2019 (KR) .......................... 10-2019-0099607

(51) Int. Cl.
*H04W 72/04* (2009.01)
*H04W 4/40* (2018.01)
(Continued)

(52) U.S. Cl.
CPC ...... *H04W 72/0446* (2013.01); *H03G 3/3036* (2013.01); *H03G 3/3089* (2013.01);
(Continued)

(58) Field of Classification Search
CPC . H04L 5/0053; H04L 27/3809; H04L 5/0048; H04L 27/26; H04L 5/06;
(Continued)

(56) References Cited

U.S. PATENT DOCUMENTS

| | | | |
|---|---|---|---|
| 2004/0176054 A1* | 9/2004 | Zeira | H04W 52/52 455/127.2 |
| 2015/0146562 A1 | 5/2015 | Sivanesan et al. | |

(Continued)

FOREIGN PATENT DOCUMENTS

| | | |
|---|---|---|
| WO | WO 2015/080853 | 6/2015 |
| WO | WO 2015/130067 | 9/2015 |
| WO | WO 2017/023150 | 2/2017 |

OTHER PUBLICATIONS

"Link level simulations of DMRS design for NR V2X"; 3GPP TSG-RAN WG1 Meeting #94bis R1-1811605 Chengdu, China, Oct. 2018; Ericsson (Year: 2018).*

(Continued)

*Primary Examiner* — Benjamin H Elliott, IV
(74) *Attorney, Agent, or Firm* — The Farrell Law Firm, P.C.

(57) ABSTRACT

The present disclosure relates to a communication method and system for converging a $5^{th}$-Generation (5G) communication system for supporting higher data rates beyond a $4^{th}$-Generation (4G) system with a technology for Internet of Things (IoT). The present disclosure may be applied to intelligent services based on the 5G communication technology and the IoT-related technology, such as smart home, smart building, smart city, smart car, connected car, health care, digital education, smart retail, security and safety services. A method by a first terminal in a wireless communication system is provided. The method includes determining whether to transmit a preamble for an automatic gain control (AGC), determining a slot and at least one symbol in the slot to transmit the preamble for the AGC, in a case in which it is determined to transmit the preamble for the AGC, (Continued)

and transmitting, to a second terminal, the preamble for the AGC in the determined slot and the at least one symbol in the slot.

8 Claims, 19 Drawing Sheets

(51) Int. Cl.
　　　*H03G 3/30*　　　(2006.01)
　　　*H04L 5/00*　　　(2006.01)
(52) U.S. Cl.
　　　CPC ........ *H04W 4/40* (2018.02); *H03G 2201/307* (2013.01); *H04L 5/0048* (2013.01)
(58) Field of Classification Search
　　　CPC ... H04W 72/0446; H04W 4/40; H04W 74/08; H04W 76/02
　　　See application file for complete search history.

(56) References Cited

U.S. PATENT DOCUMENTS

| | | | | |
|---|---|---|---|---|
| 2015/0146585 A1* | 5/2015 | Rashid | ............... | H04W 28/0205 370/278 |
| 2015/0270939 A1* | 9/2015 | Ro | ...................... | H04L 27/2613 370/329 |
| 2016/0183204 A1* | 6/2016 | Seo | ....................... | H04W 52/52 455/127.2 |
| 2016/0302180 A1* | 10/2016 | Nory | .................... | H04L 27/2607 |
| 2016/0366658 A1* | 12/2016 | Chae | ................... | H04L 27/2628 |
| 2016/0381708 A1* | 12/2016 | Li | ......................... | H04L 5/0044 370/330 |
| 2018/0167974 A1* | 6/2018 | Li | ......................... | H04W 28/08 |
| 2018/0234967 A1* | 8/2018 | Kim | ....................... | H04W 4/40 |
| 2018/0302247 A1* | 10/2018 | Aoki | ....................... | H04B 7/04 |
| 2018/0324733 A1* | 11/2018 | Chae | ................. | H04W 56/0095 |
| 2019/0132723 A1* | 5/2019 | Sorrentino | ............ | H04W 72/10 |
| 2019/0173613 A1* | 6/2019 | Sorrentino | ............ | H04L 1/0029 |
| 2019/0182085 A1* | 6/2019 | Nory | .................... | H04L 5/0053 |
| 2019/0306923 A1* | 10/2019 | Xiong | ................. | H04W 72/042 |
| 2019/0364585 A1* | 11/2019 | Lee | ....................... | H04L 5/0044 |
| 2020/0007374 A1* | 1/2020 | Martinez | ............. | H04L 27/2636 |
| 2020/0008026 A1* | 1/2020 | Martinez | ............... | H04W 28/26 |
| 2020/0145270 A1* | 5/2020 | Nguyen | ................ | H04L 5/0023 |
| 2020/0146000 A1* | 5/2020 | Shin | .................. | H04W 72/0446 |
| 2020/0187190 A1* | 6/2020 | Gao | ...................... | H04W 56/00 |

OTHER PUBLICATIONS

Samsung, "Discussion on AGC Settling issue for NR Sidelink", R1-1808779, 3GPP TSG RAN WG1 Meeting #94, Aug. 20-24, 2018, 5 pages.

International Search Report dated Feb. 19, 2020 issued in counterpart application No. PCT/KR2019/014826, 4 pages.

3GPP Draft, "Sidelink", 3rd Generation Partnership Project (Release 14), 3GPP TS 36.211 V14.7.0, Jun. 27, 2018, 43 pages.

3GPP, 5G; NR; Physical Channels and Modulation (3GPP TS 38.211 Version 15.2.0 Release 15), ETSI TS 138 211 V15.2.0, Jul. 2018, 98 pages.

European Search Report dated May 19, 2022 issued in counterpart application No. 19878362.3-1203, 8 pages.

* cited by examiner

FIG. 1D

One symbol pattern d-10

| | |
|---|---|
| 2/3 | CDM group1 |
| 0/1 | CDM group0 |
| 2/3 | CDM group1 |
| 0/1 | CDM group0 |
| 2/3 | CDM group1 |
| 0/1 | CDM group0 |
| 2/3 | CDM group1 |
| 0/1 | CDM group0 |
| 2/3 | CDM group1 |
| 0/1 | CDM group0 |
| 2/3 | CDM group1 |
| 0/1 | CDM group0 |

Two symbol pattern d-20

| | |
|---|---|
| 2/3/6/7 | CDM group1 |
| 0/1/4/5 | CDM group0 |
| 2/3/6/7 | CDM group1 |
| 0/1/4/5 | CDM group0 |
| 2/3/6/7 | CDM group1 |
| 0/1/4/5 | CDM group0 |
| 2/3/6/7 | CDM group1 |
| 0/1/4/5 | CDM group0 |
| 2/3/6/7 | CDM group1 |
| 0/1/4/5 | CDM group0 |
| 2/3/6/7 | CDM group1 |
| 0/1/4/5 | CDM group0 |

One symbol pattern d-30

| | |
|---|---|
| 4/5 | CDM group2 |
| 4/5 | |
| 2/3 | CDM group1 |
| 2/3 | |
| 0/1 | CDM group0 |
| 0/1 | |
| 4/5 | CDM group2 |
| 4/5 | |
| 2/3 | CDM group1 |
| 2/3 | |
| 0/1 | CDM group0 |
| 0/1 | |

Two symbol pattern d-40

| | |
|---|---|
| 4/5/10/11 | CDM group2 |
| 4/5/10/11 | |
| 2/3/8/9 | CDM group1 |
| 2/3/8/9 | |
| 0/1/6/7 | CDM group0 |
| 0/1/6/7 | |
| 4/5/10/11 | CDM group2 |
| 4/5/10/11 | |
| 2/3/8/9 | CDM group1 |
| 2/3/8/9 | |
| 0/1/6/7 | CDM group0 |
| 0/1/6/7 | |

METHOD AND APPARATUS FOR AUTOMATIC GAIN CONTROL IN VEHICLE-TO-EVERYTHING SYSTEM

CROSS-REFERENCE TO RELATED APPLICATION(S)

This application is based on and claims priority under 35 U.S.C. § 119 to Korean Patent Application No. 10-2018-0133629, filed on Nov. 2, 2018, in the Korean Intellectual Property Office, and Korean Patent Application No. 10-2019-0099607, filed on Aug. 14, 2019, in the Korean Intellectual Property Office, the disclosures of which are incorporated herein by reference in their entireties.

BACKGROUND

1. Field

The disclosure relates generally to a mobile communication system and, more particularly, to a method and apparatus for more efficiently performing automatic gain control (AGC) and data signal reception by a terminal (i.e., user equipment (UE)) supporting vehicle-to-everything (V2X) communication.

2. Description of Related Art

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'. The 5G communication system is, considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, Machine Type Communication (MTC), and Machine-to-Machine (M2M) communication may be implemented by beamforming, MIMO, and array antennas. Application of a cloud Radio Access Network (RAN) as the above-described Big Data processing technology may also be considered to be as an example of convergence between the 5G technology and the IoT technology.

SUMMARY

The present disclosure has been made to address the above-mentioned problems and disadvantages, and to provide at least the advantages described below.

In accordance with an aspect of the disclosure, a method by a first terminal in a wireless communication system includes determining whether to transmit a preamble for an AGC; determining a slot and at least one symbol in the slot to transmit the preamble for the AGC, in a case in which it is determined to transmit the preamble for the AGC; and transmitting, to a second terminal, the preamble for the AGC in the determined slot and the at least one symbol in the slot.

In accordance with another aspect of the disclosure, a method by a second terminal in a wireless communication system includes determining whether to receive a preamble for an AGC; monitoring a slot and at least one symbol in the slot to receive the preamble for AGC, in a case in which it is determined to receive the preamble for the AGC; and receiving, from a first terminal, the preamble for the AGC in the slot and the at least one symbol in the slot, wherein the slot and the at least one symbol in the slot to receive the preamble for AGC is determined by the first terminal, in a case in which it is determined by the first terminal to transmit the preamble for the AGC.

In accordance with another aspect of the disclosure, a first terminal in a wireless communication system includes a transceiver configured to communicate with other network entities; and a controller configured to determine whether to transmit a preamble for an AGC, determine a slot and at least one symbol in the slot to transmit the preamble for the AGC, in a case in which it is determined to transmit the preamble for the AGC, and transmit, to a second terminal, the preamble for the AGC in the determined slot and the at least one symbol in the slot.

In accordance with another aspect of the disclosure, a second terminal in a wireless communication system includes a transceiver configured to communicate with other network entities; and a controller configured to determine whether to receive a preamble for an AGC, monitor a slot and at least one symbol in the slot to receive the preamble for the AGC, in a case in which it is determined to receive the preamble for the AGC, and receive, from a first terminal, the preamble for the AGC in the slot and the at least one symbol in the slot, wherein the slot and the at least one symbol in the slot to receive the preamble for AGC is determined by the first terminal, in a case in which it is determined by the first terminal to transmit the preamble for the AGC.

BRIEF DESCRIPTION OF THE DRAWINGS

The above and other aspects, features, and advantages of certain embodiments of the present disclosure will be more apparent from the following description taken in conjunction with the accompanying drawings, in which:

FIG. 1D is a diagram illustrating DMRS patterns (type1 and type2) used for communication between a next generation NodeB (gNB) and a user equipment (UE) in a new radio (NR) system, according to an embodiment;

DETAILED DESCRIPTION

Figure 1A:
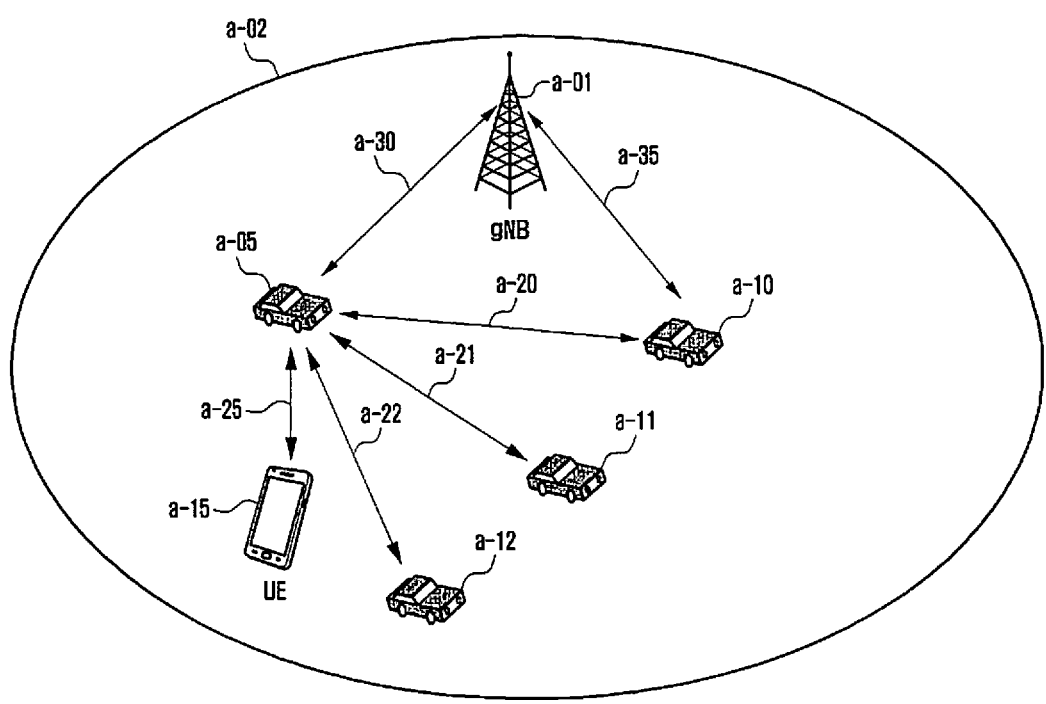
FIG. 1A is a diagram illustrating V2X communication in a cellular system, according to an embodiment.

An aspect of the disclosure is to provide a method and apparatus for effectively performing AGC for control and data signal reception by a UE supporting V2X in an environment in which a variety of numerologies are supported. Another aspect of the disclosure is to provide a configuration of a base station (gNB) for a terminal (i.e., a UE) that performs AGC and the operation of the UE.

Various embodiments of the present disclosure are described with reference to the accompanying drawings. However, various embodiments of the present disclosure are not limited to particular embodiments, and it should be understood that modifications, equivalents, and/or alternatives of the embodiments described herein can be variously made. With regard to description of drawings, similar components may be marked by similar reference numerals.

In describing the disclosure below, a detailed description of related known configurations or functions incorporated herein will be omitted when it is determined that the detailed description thereof may unnecessarily obscure the subject matter of the disclosure. The terms which will be described below are terms defined in consideration of the functions in the disclosure, and may be different according to users, intentions of the users, or customs. Therefore, the definitions of the terms should be made based on the contents throughout the specification.

Terms for identifying connection nodes, terms referring to network entities, terms referring to messages, terms referring to interfaces between network entities, and terms referring to various types of identification information which are used in the following description are illustrated for convenience of description. Therefore, the disclosure may not be limited by the terminologies provided below, and other terms that indicate subjects having equivalent technical meanings may be used.

For convenience of description, the disclosure uses terms and names defined in a 3rd Generation Partnership Project LTE (3GPP LTE). However, the disclosure is not limited to the above terms and names, and may be equally applied to systems conforming to other standards such as 3GPP NR.

FIG. 1A is a diagram illustrating V2X communication in a cellular system, according to an embodiment.

V2X collectively refers to communication technology through all interfaces with vehicles, and includes vehicle-to-vehicle (V2V), vehicle-to-infra-structure (V2I), and vehicle-to-pedestrian (V2P), depending on its shape and the components consisting of communication. V2P and V2V fundamentally follow the structure and operation principle of Rel-13 device-to-device (D2D).

Referring to FIG. 1A, a gNB a-01 includes at least one vehicle UE a-05, a-10, a-11, and a12 positioned in a cell a-02 supporting V2X and a pedestrian portable UE a-15. That is, the vehicle UE a-05 performs cellular communication with the gNB a-01 using vehicle UE-to-gNB links Uu a-30 and a-35, and performs D2D communication with the other vehicle UEs a-10, a-11, and a-12 or the pedestrian portable UE a-15 using sidelinks (PC5) a-20, a-21, a-22, and a-25. In order for the vehicle UE a-05 to directly exchange information with the other vehicle UEs and the pedestrian portable UE using the sidelink, the gNB has to allocate a resource pool that can be used for sidelink communication.

In an LTE system, resource allocation may be divided into two types, a scheduled resource allocation (mode 3) and an UE autonomous resource allocation (mode 4) according to a method for a gNB to allocate resources to a UE for V2X sidelink communication. In the case of the scheduled resource allocation, a gNB allocates resources used for sidelink transmission to radio resource control (RRC)-connected UEs in a dedicated scheduling manner. The above method is effective for interference management and resource pool management (dynamic allocation and semi-persistence transmission) because the gNB can manage the resources of the sidelink. In the case of the scheduled resource allocation (mode 3) in which the gNB allocates and manages resources for V2X, when the RRC-connected UE has data to be transmitted to other UEs, the data may be transmitted to the gNB using an RRC message or a medium access control (MAC) control element (CE). In this case, SidelinkUEInformation and UEAssistanceInformation messages may be used as the RRC message. Meanwhile, the MAC CE may be, for example, a buffer status report MAC CE in a new format (including at least an indicator indicating that the corresponding report is a buffer status report for V2P communication and information on the size of data buffered for D2D communication). The detailed format and contents of the buffer status report that 3GPP uses is based on the 3GPP standard TS36.321 "E-UTRA MAC Protocol Specification". On the other hand, in case of the UE autonomous resource allocation, a gNB provides a sidelink transmission/reception resource pool for V2X as system information and a UE selects a resource pool according to a predetermined rule. The resource selection method may include zone mapping or sensing-based resource selection and random selection.

Figure 1B:
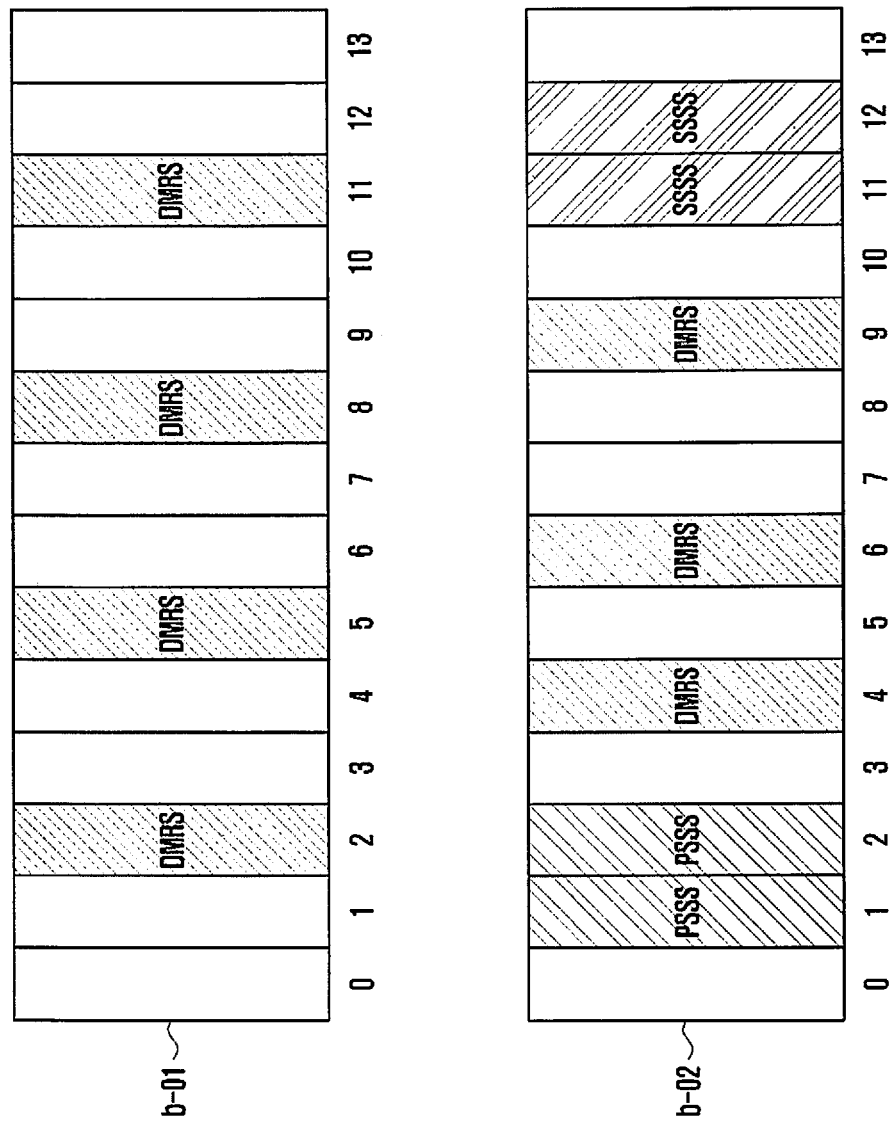
FIG. 1B is a diagram illustrating a demodulation reference signal (DMRS) pattern considered for V2X, according to an embodiment.

FIG. 1B is a diagram illustrating a DMRS pattern considered for V2X, according to an embodiment.

Since V2X is a vehicle-to-vehicle communication, UE reception performance has to be guaranteed, even in a high-speed mobile environment. Accordingly, as illustrated in FIG. 1B, in an LTE system, four DMRSs are assigned to symbol indexes {2,5,8,11} for a PSCCH and a physical sidelink shared channel (PSSCH), and three DMRSs except for symbols for a primary sidelink synchronization signal (PSSS) and a secondary sidelink synchronization signal (SSSS) are assigned to symbol indexes {5,7,10} for a physical sidelink broadcast channel (PSBCH).

Figure 1C:
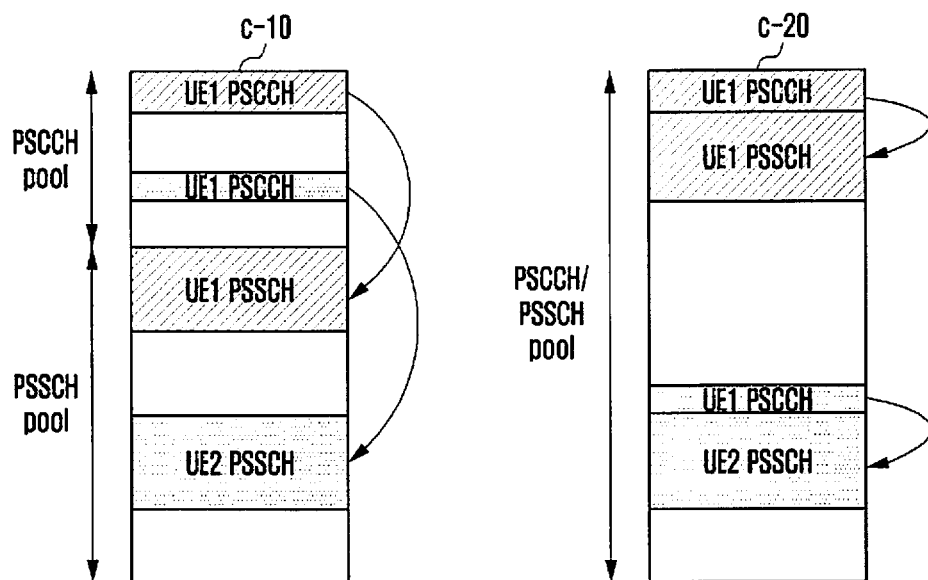
FIG. 1C is a diagram illustrating two methods of allocating physical sidelink control channel (PSCCH) and PSSCH by frequency division multiplexing (FDM), according to an embodiment.

Therefore, a DMRS structure is designed in consideration of the channel estimation performance and frequency offset estimation performance of a sidelink by reducing the spacing of DMRS symbols as much as possible. In addition, since V2X service exchanges information related to vehicle safety, the delay time of transmission and reception should be minimized to the extent that it can guarantee safety between vehicles. To this end, as illustrated in FIG. 1C, a frequency division multiplexing (FDM) method of simultaneously transmitting data channels and control channels in different frequency domains in the same subframe is used. Therefore, the delay time can be reduced by simultaneously receiving the data channel and the control channel to process them at the same time.

FIG. 1C is a diagram illustrating two methods of allocating PSCCH and PSSCH by FDM, according to an embodiment.

Referring to FIG. 1C, c-10 indicates a non-adjacent allocation scheme that separates PSCCH and PSSCH allocation resource regions in one subframe to support the transmission and reception of multiple V2X UEs. c-20 indicates an adjacent allocation scheme that continuously assigns PSCCH and PSSCH to one subchannel to support the transmission and reception of multiple V2X UEs.

FIG. 1D is a diagram illustrating DMRS patterns (type 1 and type 2) used for communication between a gNB and a UE in an NR system, according to an embodiment.

In an NR system, two DMRS patterns are supported. Two DMRS patterns are illustrated in detail in FIG. 1D. In FIG. 1D, d-10 and d-20 represent DMRS type 1, wherein d-10 represents a one-symbol pattern and d-20 represents a two-symbol pattern.

DMRS type 1 of d-10 or d-20 is a DMRS pattern of a comb 2 structure and may be composed of two code division multiplexing (CDM) groups, and different CDM groups are subjected to FDM. Specifically, in d-10 and d-20, each of portions marked in green represents CDM group 0 and each of the portions marked in red represents CDM group 1.

In the one-symbol pattern of d-10, two DMRS ports can be distinguished by applying CDM in a frequency to the same CDM group, wherein a total of four orthogonal DMRS ports can be configured. DMRS port identifications (IDs) respectively mapped to the CDM groups are illustrated in d-10 (in the case of downlink, the DMRS port ID is indicated by being+1000 to the illustrated number).

In the two-symbol pattern of d-20, four DMRS ports can be distinguished by applying CDM in time/frequency to the same CDM group, wherein a total of eight orthogonal DMRS ports can be configured. DMRS port IDs respectively mapped to the CDM groups are illustrated in d-20 (in the case of downlink, the DMRS port ID is indicated by being+1000 to the illustrated number).

Unlike this, DMRS type 2 of d-30 or d-40 is a DMRS pattern of a structure in which frequency division-orthogonal cover code (FD-OCC) is applied to adjacent subcarriers in a frequency and may be composed of three CDM groups, and different CDM groups are subjected to FDM. Specifically, in d-20 and d-30, each portion marked in blue represents CDM group 0, each portion marked in green represents CDM group 1, and each portion marked in red represents CDM group 2.

In the one-symbol pattern of d-30, two DMRS ports can be distinguished by applying CDM in frequency to the same CDM group, wherein a total of six orthogonal DMRS ports can be configured. DMRS port IDs respectively mapped to the CDM groups are illustrated in d-30 (in the case of downlink, the DMRS port ID is indicated by being+1000 to the illustrated number).

In the two-symbol pattern of d-40, four DMRS ports can be distinguished by applying CDM in time/frequency to the same CDM group, wherein a total of 12 orthogonal DMRS ports can be configured. DMRS port IDs respectively mapped to the CDM groups are illustrated in d-40 (in the case of downlink, the DMRS port ID is indicated by being+1000 to the illustrated number).

As described above, in the NR system, two different DMRS patterns (d-10 and d-20 or d-30 and d-40) may be configured, and whether the DMRS pattern is the one-symbol pattern (d-10 and d-30) or the adjacent two-symbol pattern (d-20 and d-40) can also be configured. In addition, a gNB may not only schedule a DMRS port number but also configure and signal the number of CDM groups scheduled together for physical downlink shared channel (PDSCH) rate matching. In case of cyclic prefix (CP)-OFDM, both the above-described two DMRS patterns are supported in downlink (DL) and uplink (UL), and in case of discrete fourier transform-spread-OFDM (DFT-S-OFDM), only DMRS type 1 is supported among the above-described DMRS patterns in UL. An additional DMRS is supported to be configurable.

A front-loaded DMRS refers to a first DMRS that appears in the frontmost (i.e., earliest) symbol in time, and the additional DMRS refers to a DMRS that appears in a symbol after the front-loaded DMRS. In the NR system, the number of additional DMRSs can be configured from a minimum of zero to a maximum of three. In addition, the same pattern as the front-loaded DMRS is assumed when an additional DMRS is configured.

More specifically, when information indicating whether the front-loaded DMRS is the above-described DMRS pattern type 1 or type 2, information indicating whether the DMRS pattern is the one-symbol pattern or the adjacent two-symbol pattern, and information on the number of CDM groups used with the DMRS port are indicated, in a case in which the additional DMRS is additionally configured, the additional DMRS is configured in the same manner as the front-loaded DMRS.

In the case of the LTE system, when the vehicle. UE a-05 performs D2D communication with the other vehicle UEs a-10, a-11, and a-12 or the pedestrian portable UE a-15 using the sidelinks (PC5) a-20, a-21, a-22, and a-25, as described above with reference to FIG. 1A, the vehicle UE a-05 was only supported in the form of simultaneously transmitting data to a plurality of unspecific nodes a-10, a-11, a-12, and a-15 through a broadcast.

However, in the NR system, support can be considered in the form in which the vehicle UE a-05 transmits data to only one specific node through unicast or transmits data to a plurality of specific nodes through groupcast. For example, such a unicast and groupcast technique can be usefully used in consideration of service scenarios such as platooning, which is a technology in which two or more vehicles are connected via one network and bundled and moved in a cluster.

Specifically, unicast communication may be required for the purpose of controlling a specific node by a leader node of a group connected by platooning, and groupcast communication may be required for the purpose of simultaneously controlling a group constituting of a plurality of specific nodes. In particular, since a relative speed between nodes is very small in platooning, it may be inefficient to determine the DMRS pattern of the sidelink by reducing the spacing of the DMRS symbols as much as possible only in consideration of the high-speed mobile environment of the V2X as in the LTE system. In addition, there is a need for information on a method of configuring the DMRS pattern suitable for a V2X scenario in consideration of flexible DMRS pattern configuration considered in the NR system.

Table 1 shows various numerologies defined in the NR system. A subcarrier spacing $\Delta f$ is determined according to numerology $\mu$, and a supported cyclic prefix (CP) length is determined. Table 1 shows OFDM symbols and CP lengths according to the numerology.

TABLE 1

| $\mu$ | $\Delta f = 2^{\mu} \cdot 15[\text{kHz}]$ | Cyclic prefix | Symbol duration [μsec] | CP length [μsec] |
|---|---|---|---|---|
| 0 | 15 | Normal | 66.67 | 4.69 |
| 1 | 30 | Normal | 33.33 | 2.34 |
| 2 | 60 | Normal, Extended | 16.67 | 1.17 (4.17 for ECP) |
| 3 | 120 | Normal | 8.33 | 0.59 |
| 4 | 240 | Normal | 4.17 | 0.29 |

Tables 2 and 3 show the number of OFDM symbols per slot, the number of slots per frame, and the number of slots per subframe in a normal CP and an extended CP, respectively.

TABLE 2

| $\mu$ | $N_{symb}^{slot}$ | $N_{slot}^{frame, \mu}$ | $N_{slot}^{subframe, \mu}$ |
|---|---|---|---|
| 0 | 14 | 10 | 1 |
| 1 | 14 | 20 | 2 |
| 2 | 14 | 40 | 4 |

TABLE 2-continued

| $\mu$ | $N_{symb}^{slot}$ | $N_{slot}^{frame, \mu}$ | $N_{slot}^{subframe, \mu}$ |
|---|---|---|---|
| 3 | 14 | 80 | 8 |
| 4 | 14 | 160 | 16 |

TABLE 3

| $\mu$ | $N_{symb}^{slot}$ | $N_{slot}^{frame, \mu}$ | $N_{slot}^{subframe, \mu}$ |
|---|---|---|---|
| 2 | 12 | 40 | 4 |

In the NR system, type A and type B are defined as PDSCH or PUSCH mapping type. In PDSCH or PUSCH mapping type A, a first symbol of DMRS symbols is positioned in a second or third OFDM symbol of a slot, and in PDSCH or PUSCH mapping type B, a first symbol of DMRS symbols is positioned in a first OFDM symbol of a time domain resource allocated for PUSCH transmission. In a case of data transmission for PDSCH or PUSCH, time domain resource assignment may be transmitted by information about a slot in which data is transmitted and a start symbol position S in the corresponding slot and the number of symbols L to which data is mapped. In the above, S may be a relative position from the beginning of the slot, L may be the number of consecutive symbols, and S and L may be determined from a start and length indicator value (SLIV) defined as follows.

if $(L-1) \leq 7$ then $SLIV = 14 \cdot (L-1) + S$ else $SLIV = 14 \cdot (14-L+1) + (14-1-S)$ where $0 < L \leq 14-S$ In the NR system, in general, RRC configuration may allow a UE to receive a configuration of a table including, in one row, an SLIV value, a PDSCH or PUSCH mapping type, and information on a slot in which a PDSCH or PUSCH is transmitted. Thereafter, a gNB indicates an index value in the configured table for the purpose of time domain resource allocation of the DCI, so that the gNB can transmit, to the UE, the SLIV value, the PDSCH or PUSCH mapping type, and the information on a slot for the PDSCH or PUSCH.

A problem of AGC in a V2X communication environment is described in consideration of the various numerologies defined in the above-described NR system and a time domain resource allocation method for data transmission. First, as to the AGC, the UE performs, when receiving a signal, an operation of amplifying the received signal. Determining how much the signal is amplified in the amplification operation may depend on the strength of the signal and the dynamic range of a UE amplifier.

The dynamic range is a range of the signal strength in which the input and output of the amplifier have a linear relationship. If the input and output of the amplifier do not have the linear relationship and the phase of the signal is arbitrarily changed, the corresponding signal may not be available for data reception. However, if the intensity of amplification is too large, the signal is not amplified by more than a predetermined intensity and the phase of the signal is arbitrarily changed, and therefore the UE may not arbitrarily amplify the received signal. Also, if the intensity of the amplification is too small, there may be a degradation of data reception performance. Accordingly, the UE needs to amplify the received signal with an appropriate strength. Therefore, when the UE performs amplification, it may be important to find out the strength of the received signal first. For example, this may be to perform an operation of decreasing the amplification degree when the strength of the received signal is too large and increasing the amplification degree when the received signal is too small. As described above, the UE needs to change the amplification degree according to the strength of the received signal, and this operation is called AGC.

Figure 1E:
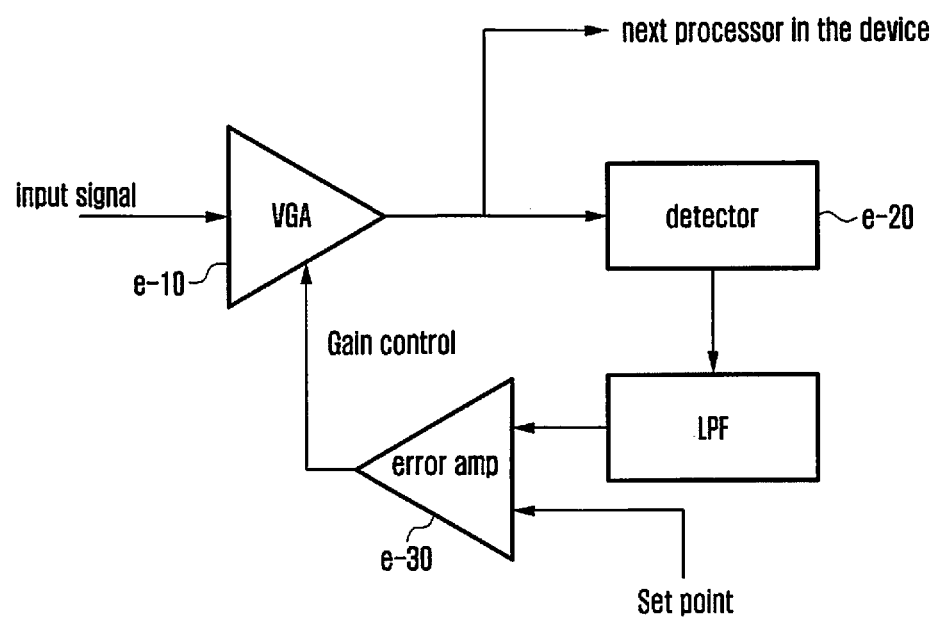
FIG. 1E is a diagram illustrating a partial structure of a receiver of a UE for performing AGC, according to an embodiment.

FIG. 1E is a diagram illustrating a partial structure of a receiver of a UE for performing AGC, according to an embodiment.

Referring to FIG. 1E, the received signal (input signal) of a UE is first amplified through a variable gain amplifier (VGA) e-10, and the amplified signal is transmitted to a detector e-20 that estimates the amplification intensity. The signal strength estimated in this manner is compared with a set point determined by the dynamic range of the UE, a difference therebetween is confirmed by an error amplifier e-30, and this gain control is transmitted to a parameter of the VGA. The amplification degree is determined in the VGA according to a difference between the estimated signal intensity and the set point, and the amplification degree serves to allow the amplified signal to be included in the dynamic range of the UE amplifier. As a result, the AGC operation may be a process of determining how much the received signal is amplified.

Figure 1F:
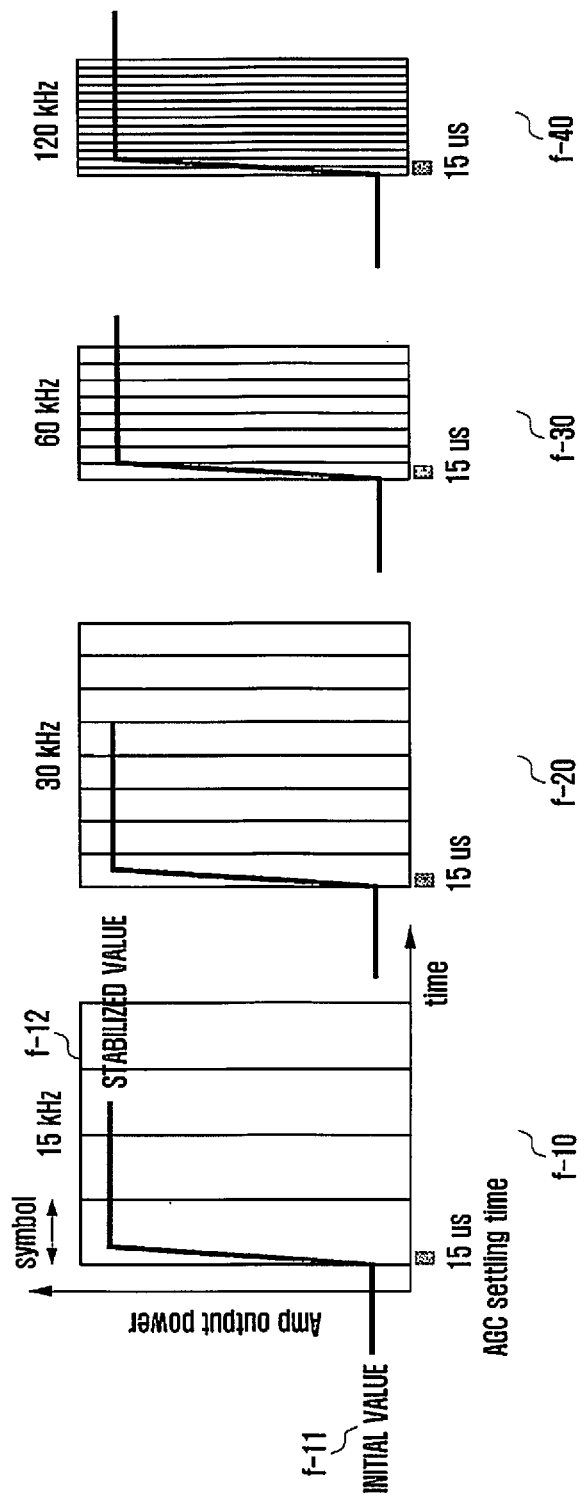
FIG. 1F is a diagram illustrating an example of the strength of a signal passing through an amplifier when AGC is performed, if orthogonal frequency division multiplexing (OFDM) symbols are received over time, according to an embodiment.

FIG. 1F is a diagram illustrating an example of the strength of a signal passing through an amplifier when AGC is performed, if OFDM symbols (CP-OFDM or DFT-S-OFDM symbols) are received over time, according to an embodiment.

Referring to FIG. 1F, as a signal is received, a UE performs an AGC operation, and it takes time to determine an amplification degree for amplifying the received signal with an appropriate intensity. The time taken to determine an appropriate amplification degree of an amplifier through the AGC may be referred to as an AGC settling time. The UE determines the amplification degree by performing AGC during a first partial period at the reception of control and data signals. Since a signal received during the AGC settling time is not reliable, the signal may be difficult to be used for decoding data or control signals. Thus, a signal, according to a value f-12 stabilized after the AGC settling time, may be used for decoding the data or control signals.

FIG. 1F illustrates, when the AGC settling time is 15 μsec, time occupied by the AGC in accordance with symbol lengths according to various numerologies defined in the NR system shown in Table 1, above. f-10, f-20, f-30, and f-40 in FIG. 1F illustrate cases in which a subcarrier spacing is 15 kHz, 30 kHz, 60 kHz, and 120 kHz, respectively.

When the subcarrier spacing is 120 kHz, as shown in f-40, the AGC settling time may occupy two symbols. Unlike this, the AGC settling time may occupy one symbol in the subcarrier spacings corresponding to f-10, f-20, and f-30. In this case, the symbol corresponding to the AGC settling time may be difficult to be used for decoding data or control signals.

In addition, in an LTE system, only QPSK and 16QAM are supported as modulation rates for PSSCH transmission, but in V2X sidelink transmission of an NR system, a high modulation rate such as 64QAM may be supported. The high modulation rate may require a longer AGC settling time compared to a low modulation rate.

In addition, flexible scheduling and a short transmission time interval (TTI) length are supported, resulting in a greater proportion of the AGC settling time compared to the scheduling of all 14 symbols. Therefore, the longer the AGC settling time, the lower a relative transmission efficiency. If a reference signal (RS) is included in an AGC settling section, a serious problem may occur in terms of reception performance because the RS cannot be used for channel estimation. For example, the front-loaded DMRS described above needs to be positioned in consideration of AGC. Therefore, there is a need to change a method of performing AGC due to the above issues in the NR system.

As described above, factors to be considered differently from the conventional LTE system in performing AGC in an NR V2X sidelink communication system have been described. Therefore, an embodiment of the disclosure provides a method of performing AGC in consideration of these problems. Another embodiment of the disclosure provides operation methods of a gNB and a UE required when performing AGC, according to the method provided in the first embodiment.

According to an embodiment, a method and apparatus for efficiently performing AGC by a UE performing NR V2X sidelink control and data signal reception is provided. As described above, in order to operate an NR system, particularly, NR V2X, a method for efficiently performing AGC needs to efficiently perform AGC in an NR sidelink communication system by consider the following four (4) factors:

1. Short symbol length according to support of widelength subcarrier spacing.

2. Long AGC settling time required to support high modulation rate.

3. Ratio of increased AGC settling section according to flexible scheduling and short TTI length support.

4. Position of RS transmitted in symbol preceding time domain in which control and data signals are transmitted.

The method of performing AGC according to factor 4 will be described according to another embodiment.

As described above with reference to FIG. 1F, the number of symbols occupied by the AGC settling time may vary according to the subcarrier spacing. Specifically, as the subcarrier spacing increases, the number of symbols occupied by the AGC settling time increases.

In addition, the AGC settling time required to perform AGC should be determined so that the reception performance is not degraded, and the AGC settling time should not be long so that the transmission efficiency is not lowered.

If only symbols for transmitting data and control signals are transmitted/received without a separate signal in order to perform AGC, a receiver has to use a first symbol of the data and control signal to perform AGC, and thus the first symbol cannot be used for decoding the data and control signal. As a result, the reception performance of the data and control signal is inevitably deteriorated. On the other hand, if a dedicated signal or preamplifier for performing AGC is transmitted before transmitting the data and control signal, a reception power amplification level may be set through the dedicated signal or preamble for performing ACG, which has been previously transmitted, even though AGC is not performed again upon receiving the data and control signal. However, since frequency and time resources are used to transmit the dedicated signal or preamble for performing AGC, the frequency and time resources may not be used for another data transmission, thereby reducing frequency usage efficiency.

Accordingly, a method of performing AGC is provided based on the above factors 1 to 3.

Figure 1G:
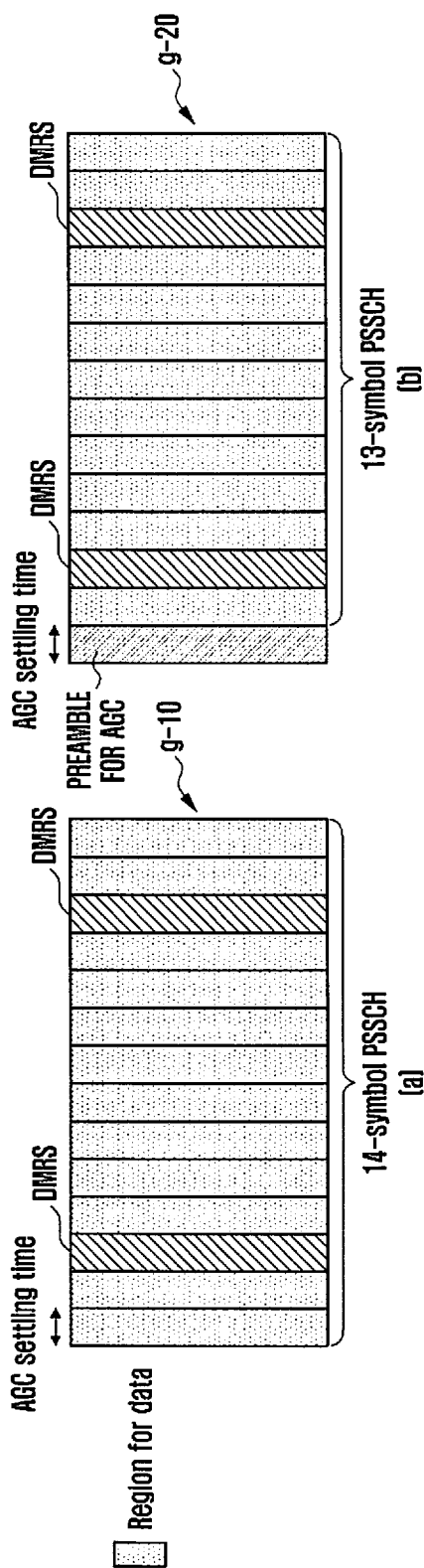
FIG. 1G is a diagram illustrating a performance degradation according to an ACG determination time for a short symbol length in accordance with support of a wide-length subcarrier spacing, according to an embodiment.
Figure 1G:
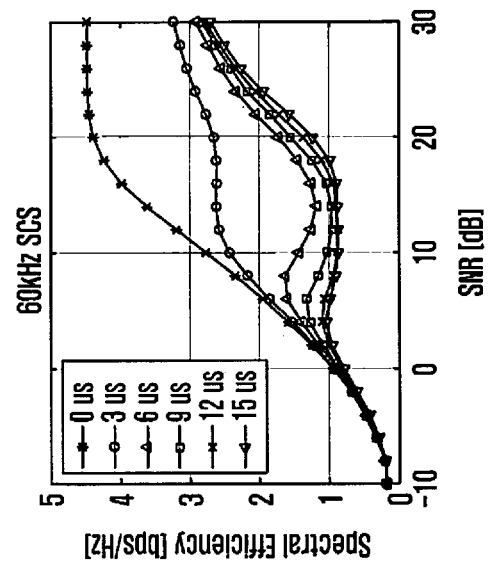

FIG. 1G is a diagram illustrating a performance degradation according to ACG determination time for a short symbol length in accordance with support of a wide-length subcarrier spacing, according to an embodiment.

Referring to FIG. 1G, in g-10 and g-20, experimental environments are shown. As shown in g-10 and g-20, in the experiments according to this figure, an experiment on a data channel is assumed, and DMRSs are positioned in third and twelfth symbols. g-10 indicates a case of not transmitting a preamble for AGC and g-20 indicates a case of transmitting a preamble for AGC in a first symbol of a slot.

In g-30, the result of assuming that 0/3/6/9/12/15 microsecond (μsec) is required as the AGC settling time for a case where a subcarrier spacing is 60 kilohertz (kHz) is shown.

From the result of g-30, it can be observed that a significant performance degradation occurs as the AGC settling time is increased in the case of the subcarrier spacing of 60 kHz. This is because the received signal cannot be used for decoding while the AGC operation is performed. Even when the AGC settling time was 3 μsec, a performance degradation of about 30% compared to the maximum transmission efficiency was observed. In a low frequency range (FR1) in an NR sidelink communication system, {15, 30, 60} kHz may be considered as the subcarrier spacing, and in a high frequency range (FR2), {60, 120} kHz may be used as the subcarrier spacing. Based on the experimental results, the disclosure provides a method to efficiently perform AGC in the NR sidelink communication system.

In particular, the method is a method of configuring a preamble for efficiently performing AGC in an NR sidelink communication system.

The method may be a method of maintaining a time domain in which control information and data signals are transmitted according to subcarrier spacing and inserting a preamble into a previous (i.e., immediately prior) symbol.

For example, when the control and data signals are mapped from a 0th symbol of a slot n, a preamble is transmitted from the last symbol or the last two symbols of a slot n−1. Alternatively, the preamble may not be defined in units of OFDM symbols, but may be transmitted by a predetermined or indicated length or a length defined as a fixed value, for example, a length corresponding to 15 usec.

In the case of FR1, a one-symbol length preamble is inserted for a subcarrier spacing corresponding to 60 kHz. However, no preamble is inserted for subcarrier spacings corresponding to 15 kHz and 30 kHz.

In the case of FR2, a one-symbol length preamble is inserted for a subcarrier spacing corresponding to 60 kHz. However, a preamble with two symbol lengths is inserted for a subcarrier spacing corresponding to 120 kHz.

In the case of FR2, a one-symbol length preamble can be inserted for 120 kHz in consideration of the preamble overhead in the same manner as in 60 kHz.

In addition, a method of inserting a preamble into a first symbol or first two symbols of a time domain in which control and data signals are transmitted according to the subcarrier spacing, and transmitting the control and data signals after the preamble is provided.

For example, if the control and data signals are allocated to be mapped from the 0th symbol of the slot n, the preamble is transmitted from the first or first two symbols of the slot n. Alternatively, the preamble may not be defined in units of OFDM symbols, but may be transmitted by a predetermined or indicated length or a length defined as a fixed value, for example, a length corresponding to 15 usec.

In the case of FR1, a one-symbol length preamble is inserted for a subcarrier spacing corresponding to 60 kHz. However, no preamble is inserted for subcarrier spacings corresponding to 15 kHz and 30 kHz.

In the case of FR2, a one-symbol length preamble is inserted for the subcarrier spacing corresponding to 60 kHz. However, a two-symbol length preamble is inserted for the subcarrier spacing corresponding to 120 kHz.

In the case of FR2, a preamble of one symbol can be inserted for 120 kHz in consideration of the preamble overhead in the same manner as in 60 kHz.

The preamble refers to a signal transmitted by a UE that transmits the control and data signals so that a UE receiving the control and data signals performs AGC, and may be replaced with other terms.

Figure 1H:
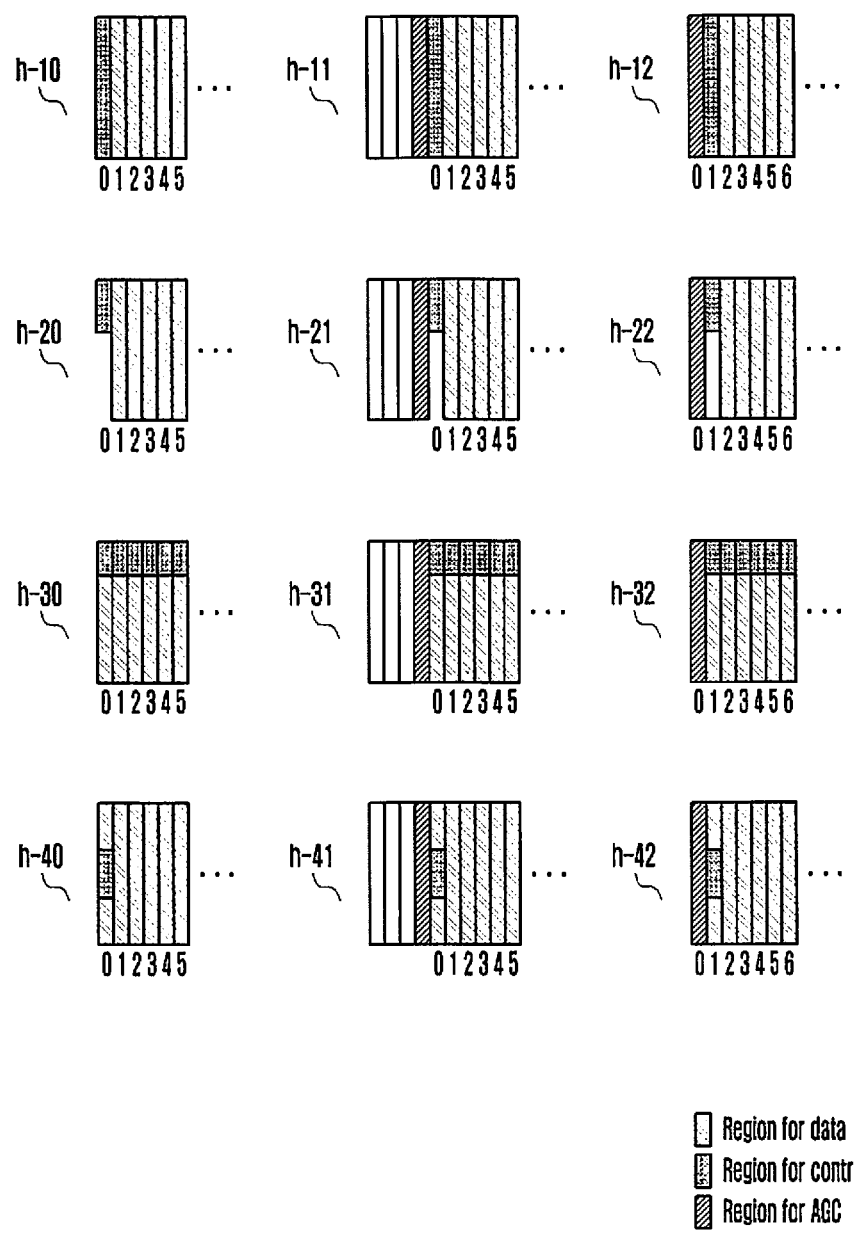
FIG. 1H is a diagram illustrating a first method and a second method, according to an embodiment.

FIG. 1H is a diagram illustrating a Method-1 and a Method-2, according to an embodiment.

Method-1 and Method-2 will be described in detail with reference to FIG. 1H.

As described above, in the case of LTE V2X sidelink, FDM through which a data channel and a control channel are simultaneously transmitted in different frequency domains is used in the same subframe, as shown in FIG. 1C. However, in the case of an NR V2X sidelink, a method in which the data channel and the control channel are subjected to FDM and a method in which the data channel and the control channel are subjected to time division multiplexing (TDM) can be considered together.

Specifically, referring to FIG. 1H, in h-10, h-20, h-30, and h-40, methods in which the data channel and the control channel are subjected to multiplexing in the NR V2X sidelink are illustrated. The methods of h-10, h-20, h-30, and h-40 will be described below.

With respect to h-10, the control channel and data channel associated with the control channel are non-overlapped and transmitted in resources in time. Additionally, the resources in frequency used by the two channels are the same.

With respect to h-20, the control channel and data channel associated with the control channel are non-overlapped and transmitted in resources in time. Additionally, the resources in frequency used by the two channels may be different.

With respect to h-30, the control channel and data channel associated with the control channel are non-overlapped in resources in frequency, and transmitted as time resources. Additionally, resources in time used by the two channels are the same.

With respect to h-40, part of the control channel and data channel associated with the part of the control channel are overlapped in resources in time and transmitted as non-overlapped frequency resources. In addition, another associated data channel or part of another control channel is transmitted in resources in time in a non-overlapped manner.

In the cases of h-10, h-20, h-30, and h-40, the control channel occupies one symbol and the data channel occupies five symbols in time. The actual number of symbols in which the control channel and the data channel are transmitted may vary.

According to Method-1, the method of maintaining the time domain in which the control and data signals are transmitted according to the subcarrier spacing and inserting the preamble into the immediately previous symbol is illustrated in h-11, h-21, h-31, and h-41. Here, an example of a case where one preamble is inserted is shown. In addition, h-11, h-21, h-31, and h-41 respectively show examples of Method-1 according to the methods h-10, h-20, h-30, and h-40 in which the data channel and the control channel are subjected to multiplexing.

According to Method-1, when the scheduling of the control and data signals is performed in the first symbol of the slot, the preamble may be inserted in the last symbol position of the previous slot.

Figure 1I:
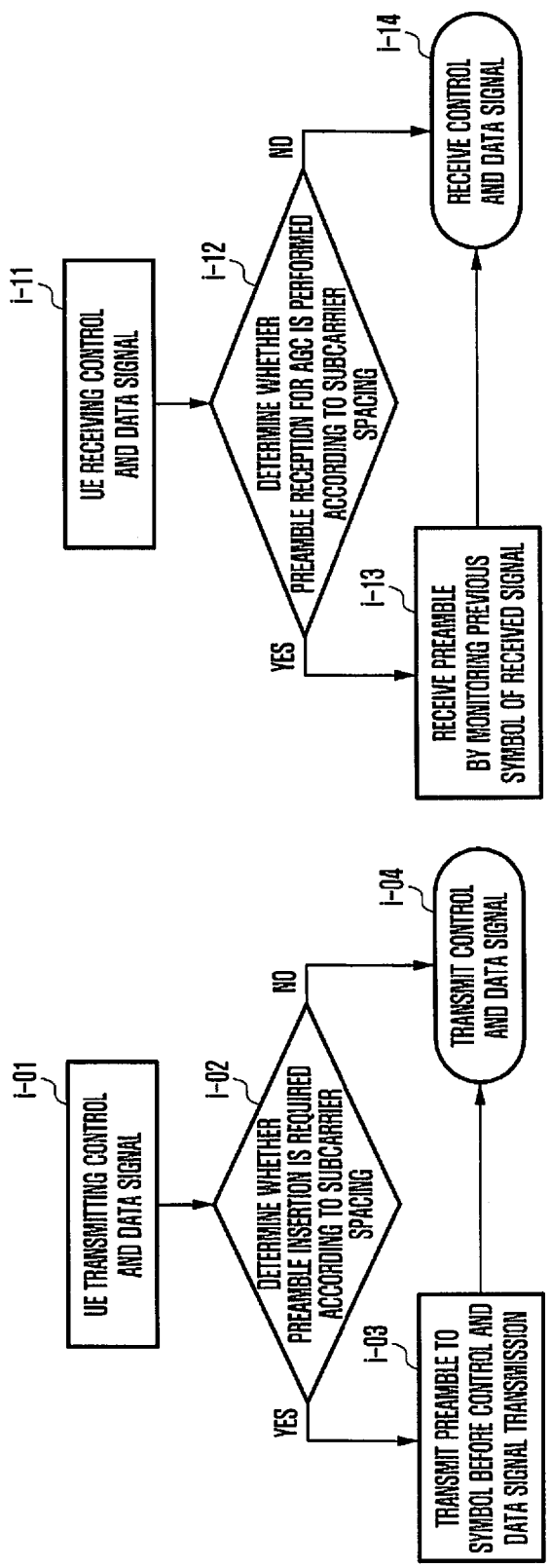
FIG. 1I is a diagram illustrating the operation of a UE in accordance with a first method, according to an embodiment.

FIG. 1I is a diagram illustrating the operation of a UE in accordance with Method-1, according to an embodiment.

The operation of a UE according to Method-1 will be described in detail with reference to FIG. 1I. According to Method-1, in step i-01, a UE transmits control and data signals. In step i-02, it is determined whether preamble insertion is required according to subcarrier spacing. If preamble insertion is required according to subcarrier spacing, then in step i-03, a preamble is transmitted to a symbol immediately before the corresponding control and data signal. If the scheduling of the control and data signals is performed in a first symbol of a slot, the UE may transmit the slot in advance before transmitting the control and data signals and may transmit the preamble in the last symbol position of the slot. If it is determined that the insertion of the preamble is not necessary according to the subcarrier spacing in step i-02, only the control and data signals are transmitted without the preamble insertion in step i-04. According to Method-1, in step i-11, a UE receives the control and data signals. In step i-12, it is determined whether the preamble reception for AGC is performed according to subcarrier spacing. If it is determined that the preamble reception for AGC is performed according to subcarrier spacing, a preamble is received by monitoring the previous symbol of the received signal in step i-13. If it is determined that the reception of the preamble for AGC is not necessary according to the subcarrier spacing in step i-12, the control and data signals are immediately received in step i-14.

Meanwhile, according to Method-2, a method of inserting a preamble into a symbol preceding a time domain in which control and data signals are transmitted at a subcarrier spacing and transmitting the control and data signals after the preamble is shown through h-12, h-22, h-32, and h-42 in FIG. 1H.

Here, an example of a case in which one preamble is inserted is shown. In addition, h-12, h-22, h-32, and h-42 respectively show examples of the Method-2 according to the methods h-10, h-20, h-30, and h-40 in which the data channel and the control channel are subjected to multiplexing.

Figure 1J:
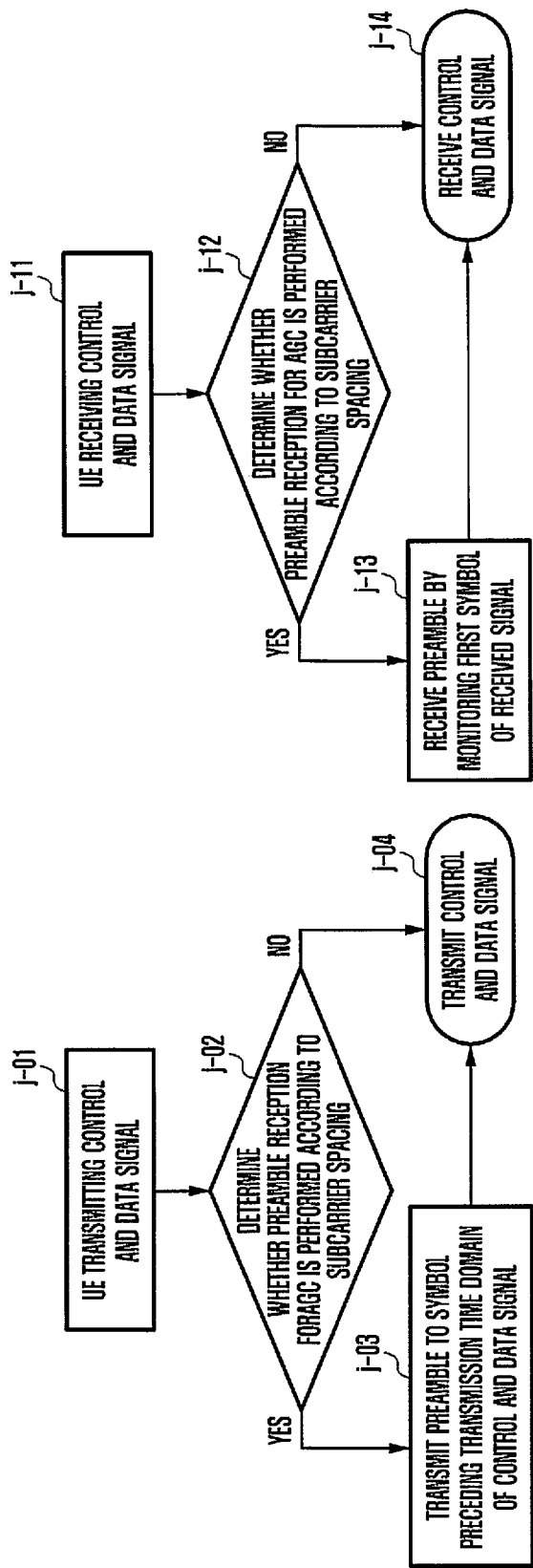
FIG. 1J is a diagram illustrating the operation of a UE in accordance with a second method, according to an embodiment.

FIG. 1J is a diagram illustrating the operation of a UE in accordance with Method-2, according to an embodiment.

The operation of a UE according to Method-2 will be described in detail with reference to FIG. 1J. According to Method-2, in step j-01, a UE transmits control and data signals. In step j-02, it is determined whether preamble reception for AGC is performed according to subcarrier spacing. If preamble reception is performed for subcarrier spacing, then in step j-3, a preamble is transmitted to a symbol preceding a transmission signal. If it is determined that the insertion of the preamble is not necessary according to the subcarrier spacing in step j-02 (if preamble reception is not performed for subcarrier spacing), only the control and data signals are required to be transmitted without the insertion of the preamble in step j-04. According to Method-2, in step j-11, a UE receives the control and data signals. In step j-12, it is determined whether preamble reception for AGC is performed according to subcarrier spacing. If it is determined that preamble reception for AGC is performed for subcarrier spacing, the preamble is received by monitoring the first symbol of the received signal in step j-13. If it is determined that the reception of the preamble for AGC is not necessary according to the subcarrier spacing in step j-12, the control and data signals are immediately received in step j-14.

Accordingly, a preamble insertion period according to Method-1 and Method-2 may be performed as follows.

For Method-1, if preamble insertion is required according to a subcarrier spacing, preamble transmission is performed for every scheduled transmission slot.

For Method-2, if preamble insertion is required according to a subcarrier spacing, preamble transmission is performed in a first scheduled transmission slot.

In addition, another method (Method-3) is possible. For example, according to Method-3, if preamble insertion is required according to a subcarrier interval, preamble transmission is performed in a first scheduled transmission slot, but the preamble is not transmitted when scheduling is performed again in slot A (i.e., first scheduled transmission slot) after first slot transmission.

Method-1 of the preamble insertion period is a method of transmitting a preamble every scheduled transmission slot, but unnecessary overhead may increase. Alternatively, Method-2 thereof may reduce unnecessary overhead by transmitting a preamble in the first scheduled transmission slot. In addition, Method-3 thereof is based on the method-2, but may reduce the overhead more than method-2 by introducing a transmission window of the slot A. Depending on which method of determining the preamble insertion period is used, the UE may perform AGC by receiving the preamble only at the corresponding time point in consideration of the preamble transmission period.

Another embodiment of the disclosure describes a method of solving an issue related to a position of an RS transmitted in a symbol preceding the time domain in which control and data signals are transmitted, corresponding to the fourth factor (factor 4) among the factors to be considered in performing AGC in the NR V2X sidelink communication system, discussed above.

In the case of the DMRS of the data channel introduced in the NR UE-to-gNB links Uu a-30 and a-35, a the front-loaded DMRS was introduced to position the DMRS in front of the time domain of the data channel to enable fast channel estimation, thereby reducing the latency of data decoding. However, when the RS is included in the AGC settling section, a serious problem may occur in terms of the reception performance because the RS cannot be used for channel estimation. For example, if the front-loaded DMRS is positioned at the first symbol of the data channel and the first symbol of the data channel is used for AGC by Method-2, disclosed above, it is necessary to determine the position of the front-loaded DMRS.

In this regard, the aforementioned Method-1 has an advantage of not having to further consider the positioning of the RS by maintaining the time domain in which the control and data signals are transmitted and inserting the preamble into the immediately preceding symbol.

As described below, a method for configuring the position of an RS in an NR V2X sidelink communication system, and specifically, a method for configuring a gNB and a UE for a DMRS is provided.

As described above, the DMRS of the data channel introduced in the NR UE-to-gNB links Uu a-30 and a-35 is designed to be configured in a flexible manner. Specifically, configuration information on the DMRS pattern in the NR system may be as follows.

DMRS information may be configured on a data channel in NR Uu communication system based on the five (5) following pieces of information.

1. DMRS position configuration including the position of front-loaded DMRS varies depending on whether corresponding DMRS pattern is PDSCH or PUSCH mapping type A and type B.

2. Whether DMRS pattern type 1 or type 2 is configured in RRC, where dmrs-Type $\in\{1,2\}$ 3. Information indicating whether front-loaded DMRS pattern is a one-symbol pattern or an adjacent two-symbol pattern configured in RRC as information on the maximum length of a DMRS symbol, where DMRS-max-len $\in\{1,2\}$ 4. Number of additional DMRSs is configured in RRC, where DMRS-max-len $\in\{1,2\}$ 5. DMRS port number and number of CDM groups are indicated through downlink control information (DCI).

The DMRS in the NR V2X sidelink communication system needs to be designed in consideration of the characteristics of the sidelink. Specifically, D2D communication is performed using other vehicle UEs a-10, a-11, and a-12; a pedestrian portable UE a-15; and side links (PC5), a-20, a-21, a-22, and a-25. Therefore, unlike cellular communication using the gNB a-01 and the vehicle UE-to-gNB links Uu a-30 and a-35, two channels, such as a PDSCH and a PUSCH, do not need to be defined. In addition, since the sidelink needs to be able to operate even when the RRC is not connected, the method of configuring the DMRS through the RRC in the NR Uu communication system is not suitable. First, the following five (5) DMRS design elements to be considered for NR sidelink communication based on the method of configuring DMRS information for the data channel in the NR Uu communication system are as follows.

1. Method of configuring DMRS position.
2. Method of configuring DMRS pattern (type 1 and type 2).
3. Method of supporting a number of orthogonal DMRS ports.
4. Method of configuring a number of additional DMRSs.
5. Method of indicating DMRS port number and a number of CDM groups.

A method based on the above considerations will be described below. First, PUSCH mapping type A and type B are recycled in the NR Uu communication system using the method of configuring the position of the DMRS in the NR sidelink. In case of PDSCH mapping type B, the DMRS is designed only for 2/4/7 when a scheduled symbol length is NCP. In case of PUSCH mapping type B, the DMRS positions for various symbol lengths are supported. Therefore, as a method of supporting a physical sidelink shared channel (PSSCH) mapping type utilizing the PUSCH mapping type A and type B in the NR Uu communication system as the method of configuring the position of the DMRS in the NR sidelink, there may be the following three (3) alternatives.

Alternative-1: support only PSSCH mapping type A.

In the case of PSSCH mapping type A, reference point 1 for position is defined from a first symbol of a slot. DMRS position in Table 4, below, is used In Table 4, one of the following methods can be selected for determining a value of $l_0$.

Only $l_0=2$ is supported

Only $l_0=3$ is supported $l_0=2$ or 3 is supported.

One of the following configuration methods may be selected to determine whether $l_0=2$ or 3.

Whether $l_0=2$ or 3 is indicated by sidelink control information (SCI)

Whether $l_0=2$ or 3 is indicated by sidelink master information block (MIB) or system information block (SIB)

Whether $l_0=2$ or 3 is indicated according to a resource pool configuration

In the case of PSSCH mapping type A, the meaning of "duration in symbols" in Table 4, below, represents a symbol duration between the first symbol of the slot and the last symbol of the scheduled PSSCH.

Alternative-2: support only PSSCH mapping type B.

In the case of PSSCH mapping type B, reference point 1 for position is defined from a first symbol of a scheduled PSSCH.

If Method-1 described above, is used, DMRS position is determined based on Table 5, below. In Table 5, the value of $l_0$ is configured as $l_0=0$.

If Method-2, described above, is used, DMRS position in Table 6 is used when a preamble for AGC is inserted for one symbol. Otherwise, DMRS position in Table 5 is used.

Figure 1K:
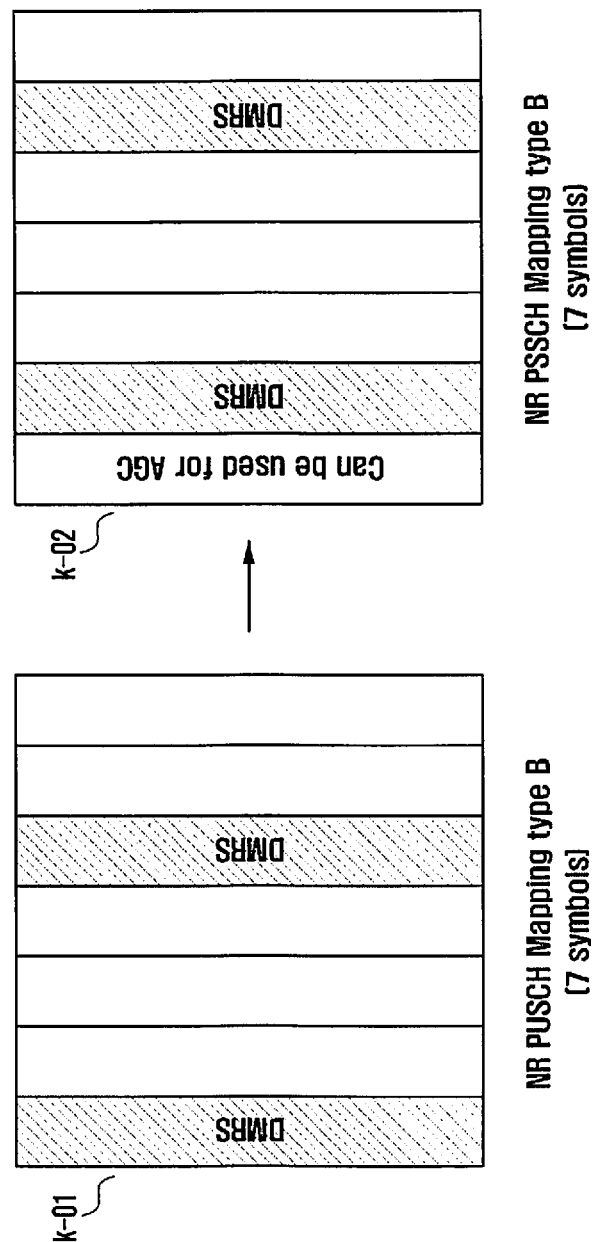
FIG. 1K is a diagram illustrating a DMRS position when the symbol length of a scheduled PSSCH is 7 and when the number of additional DMRSs is configured to one, according to an embodiment.

For example, referring to FIG. 1K, the position of the DMRS disclosed in Table 6 is shown in k-02 when the symbol length of the PSSCH scheduled is 7 and the number of additional DMRSs is configured as one. For reference, k-01 indicates a DMRS position for the existing PUSCH mapping type B in the same case.

In Table 6, below, the value of $l_0$ is configured as $l_0=0$.

If Method-2, described above, is used, DMRS position in Table 7, below, is used when a preamble for AGC is inserted for two symbols. Otherwise, DMRS position in Table 5 is used In Table 7, the value of $l_0$ is configured as $l_0=2$.

In the case of PSSCH mapping type B, the meaning of "duration in symbols" in Tables 5, 6, and 7 represents a symbol duration of the scheduled PSSCH.

Alternative-3: support both PSSCH mapping type A and type B.

If both types (type A and type B) are supported, both the DMRS positions presented in alternative-1 and alternative-2 may be used, and the method of configuring the DMRS position described in alternative-1 and alternative-2 is referred to.

To support both types, if the DMRS pattern is type A or type B, it may be indicated by SCI. If the DMRS pattern is type A or type B, it may be indicated by sidelink MIB or SIB. If the DMRS pattern is type A or type B, it may be indicated according to a resource pool configuration.

TABLE 4

| Duration in symbols | DM-RS positions PUSCH mapping type A dmrs-AdditionalPosition | | | |
|---|---|---|---|---|
| | 0 | 1 | 2 | 3 |
| <4 | — | — | — | — |
| 4 | $l_0$ | $l_0$ | $l_0$ | $l_0$ |
| 5 | $l_0$ | $l_0$ | $l_0$ | $l_0$ |
| 6 | $l_0$ | $l_0$ | $l_0$ | $l_0$ |
| 7 | $l_0$ | $l_0$ | $l_0$ | $l_0$ |
| 8 | $l_0$ | $l_0$, 7 | $l_0$, 7 | $l_0$, 7 |
| 9 | $l_0$ | $l_0$, 7 | $l_0$, 7 | $l_0$, 7 |
| 10 | $l_0$ | $l_0$, 9 | $l_0$, 6, 9 | $l_0$, 6, 9 |
| 11 | $l_0$ | $l_0$, 9 | $l_0$, 6, 9 | $l_0$, 6, 9 |
| 12 | $l_0$ | $l_0$, 9 | $l_0$, 6, 9 | $l_0$, 5, 8, 11 |
| 13 | $l_0$ | $l_0$, 11 | $l_0$, 7, 11 | $l_0$, 5, 8, 11 |
| 14 | $l_0$ | $l_0$, 11 | $l_0$, 7, 11 | $l_0$, 5, 8, 11 |

TABLE 5

| Duration in symbols | DM-RS positions PUSCH mapping type B dmrs-AdditionalPosition | | | |
|---|---|---|---|---|
| | 0 | 1 | 2 | 3 |
| <4 | $l_0$ | $l_0$ | $l_0$ | $l_0$ |
| 4 | $l_0$ | $l_0$ | $l_0$ | $l_0$ |
| 5 | $l_0$ | $l_0$, 4 | $l_0$, 4 | $l_0$, 4 |
| 6 | $l_0$ | $l_0$, 4 | $l_0$, 4 | $l_0$, 4 |
| 7 | $l_0$ | $l_0$, 4 | $l_0$, 4 | $l_0$, 4 |
| 8 | $l_0$ | $l_0$, 6 | $l_0$, 3, 6 | $l_0$, 3, 6 |
| 9 | $l_0$ | $l_0$, 6 | $l_0$, 3, 6 | $l_0$, 3, 6 |
| 10 | $l_0$ | $l_0$, 8 | $l_0$, 4, 8 | $l_0$, 3, 6, 9 |
| 11 | $l_0$ | $l_0$, 8 | $l_0$, 4, 8 | $l_0$, 3, 6, 9 |
| 12 | $l_0$ | $l_0$, 10 | $l_0$, 5, 10 | $l_0$, 3, 6, 9 |
| 13 | $l_0$ | $l_0$, 10 | $l_0$, 5, 10 | $l_0$, 3, 6, 9 |
| 14 | $l_0$ | $l_0$, 10 | $l_0$, 5, 10 | $l_0$, 3, 6, 9 |

TABLE 6

| Duration in symbols | DM-RS positions PUSCH mapping type B dmrs-AdditionalPosition | | | |
|---|---|---|---|---|
| | 0 | 1 | 2 | 3 |
| <4 | $l_0$ | $l_0$ | $l_0$ | $l_0$ |
| 4 | $l_0$ | $l_0$ | $l_0$ | $l_0$ |
| 5 | $l_0$ | $l_0$ | $l_0$ | $l_0$ |
| 6 | $l_0$ | $l_0$, 5 | $l_0$, 5 | $l_0$, 5 |
| 7 | $l_0$ | $l_0$, 5 | $l_0$, 5 | $l_0$, 5 |
| 8 | $l_0$ | $l_0$, 7 | $l_0$, 4, 7 | $l_0$, 4, 7 |
| 9 | $l_0$ | $l_0$, 7 | $l_0$, 4, 7 | $l_0$, 4, 7 |
| 10 | $l_0$ | $l_0$, 9 | $l_0$, 5, 9 | $l_0$, 5, 9 |
| 11 | $l_0$ | $l_0$, 9 | $l_0$, 5, 9 | $l_0$, 4, 7, 10 |
| 12 | $l_0$ | $l_0$, 11 | $l_0$, 6, 11 | $l_0$, 4, 7, 10 |
| 13 | $l_0$ | $l_0$, 11 | $l_0$, 6, 11 | $l_0$, 4, 7, 10 |
| 14 | $l_0$ | $l_0$, 11 | $l_0$, 6, 11 | $l_0$, 4, 7, 10 |

TABLE 7

| Duration in symbols | DM-RS positions PUSCH mapping type A dmrs-AdditionalPosition | | | |
|---|---|---|---|---|
| | 0 | 1 | 2 | 3 |
| <4 | $l_0$ | $l_0$ | $l_0$ | $l_0$ |
| 4 | $l_0$ | $l_0$ | $l_0$ | $l_0$ |
| 5 | $l_0$ | $l_0$ | $l_0$ | $l_0$ |
| 6 | $l_0$ | $l_0$ | $l_0$ | $l_0$ |
| 7 | $l_0$ | $l_0$, 6 | $l_0$, 6 | $l_0$, 6 |
| 8 | $l_0$ | $l_0$, 6 | $l_0$, 6 | $l_0$, 6 |
| 9 | $l_0$ | $l_0$, 8 | $l_0$, 5, 8 | $l_0$, 5, 8 |
| 10 | $l_0$ | $l_0$, 8 | $l_0$, 5, 8 | $l_0$, 5, 8 |
| 11 | $l_0$ | $l_0$, 10 | $l_0$, 6, 10 | $l_0$, 6, 10 |
| 12 | $l_0$ | $l_0$, 10 | $l_0$, 6, 10 | $l_0$, 5, 8, 11 |
| 13 | $l_0$ | $l_0$, 12 | $l_0$, 7, 12 | $l_0$, 5, 8, 11 |
| 14 | $l_0$ | $l_0$, 12 | $l_0$, 7, 12 | $l_0$, 5, 8, 11 |

The above Tables 4 and 5 may be used for positioning the DMRS for the NR sidelink even when the above-described Method-1 or Method-2 are not used, that is, even when a preamble for AGC is not introduced.

Next, as the DMRS pattern (type 1 and type 2) in the NR sidelink is considered, the DMRS pattern (type 1 and type 2) in the NR Uu communication system may be considered. In addition, the number of orthogonal DMRS ports supported in the NR sidelink should be considered together to determine the DMRS pattern. In consideration of the moving speed, a higher rank is generally difficult to support in a sidelink environment compared to a Uu communication environment. Thus, as described in FIG. 1D, the two-symbol pattern for supporting the plurality of orthogonal DMRS ports may be excluded from consideration. Therefore, in Tables 4, 5, 6, and 7, only the DMRS position configuration for a case where the one-symbol pattern is supported is considered. In addition, there may be the following three (3) alternatives as the method of configuring the DMRS pattern (type 1 and type 2) in the NR side link.

Alternative-1: only DMRS pattern type 1, as in Pattern d-10 of FIG. 1D

Alternative-2: only DMRS pattern type2, as in pattern d-30 of FIG. 1D.

Alternative-3: support both DMRS pattern type 1 and type 2. In this case, to support the two types, the DMRS pattern may be type 1 or type 2 indicated by SCI; the DMRS pattern may be type 1 or type 2 indicated by sidelink MIB or SIB; or the DMRS pattern may be type 1 or type 2 indicated according to resource pool configuration.

A method of indicating the NR sidelink DMRS port number and the number of CDM groups may or may not be indicated depending on the maximum number of orthogonal DMRS ports supported by the NR sidelink.

A method of configuring the number of additional DMRSs (dmrs-Additional $\in \{0,1,2,3\}$) in the NR sidelink should also be able to be indicated even without an RRC connection, unlike the NR Uu communication system. Therefore, the number of addition DMRSs may be indicated by SCI; the number of addition DMRSs may be indicated by side MIB or SIB; or the number of addition DMRSs may be indicated according to a resource pool configuration.

Accordingly, the method of configuring the position of the DMRS of mainly the data channel and a parameter configuration method have been described, but the structure of the DMRS is not limited to the data channel. Specifically, the same DMRS pattern and position configuration as the data channel may be applied to the control channel of the NR V2X sidelink. In addition, even when the DMRS structure of the control channel of the NR V2X sidelink is designed differently, if the first symbol of the control channel is used for AGC by the aforementioned Method-2, the DMRS for the control channel should not be positioned in the first symbol of the control channel. In addition, even when other reference signals for the NR V2X sidelink are introduced including the DMRS, if the first symbol of the control channel is used for AGC by the aforementioned Method-2, the symbol should be restricted so that the RS is not transmitted in the symbol. For example, even when channel state information RS (CSI-RS) for NR V2X sidelink is introduced, the RS needs to be forced not to be transmitted in the symbol position used for AGC.

According to an embodiment, a method in which a transmission UE generates a DMRS sequence for a PSSCH in a sidelink and transmits the generated DMRS sequence to a reception UE is provided. Additionally, the reception UE receives the DMRS sequence. In the sidelink, the reception UE assumes that the DMRS is transmitted using the following sequence as in Equation (1).

$$r(n) = \frac{1}{\sqrt{2}}(1 - 2 \cdot c(2n)) + j\frac{1}{\sqrt{2}}(1 - 2 \cdot c(2n+1)) \quad (1)$$

Here, r(n) denotes reference signal sequence and is defined in 38.211, C0 denotes a pseudo-random sequence and is defined in 38.211 Section 5.2.1 The pseudo-random sequence may be initialized as follows in Equation (2).

$$c_{init} = (2^{17}(N_{symb}^{slot}n_{s,f}^{\mu}+l+1)(2N_{ID}^{nSCID}+1) + 2N_{ID}^{nSCID} + n_{SCID}) \bmod 2^{31} \quad (2) + n_{scip}) \bmod 2^{31}$$

Here, l∥denotes an OFDM symbol number in a slot, and $n_{s,f}^{\mu}$ denotes a slot number in a frame. In the sidelink, $n_{SCID}=0$ is assumed and $N_{ID}^{nSCID}$ may be assumed by the following five (5) methods.

Method 1 is decimal of PSCCH CRC. Here, $n_{ID}^{nSCID}=\Sigma_{i=0}^{K-1-i} p_i \cdot 2^{L-1-i}$ is satisfied, and see 5.1 of TS38.212 for values of p and L.

Method 2 is destination ID. Here, $N_{ID}^{nSCID}$ is assumed as a destination ID value in SCI.

Method 3 is source ID. Here, $N_{ID}^{nSCID}$ is assumed as source ID value in SCI.

Method 4 is sidelink synchronization ID. Here, $N_{ID}^{nSCID}$ is assumed as sidelink synchronization $ID(N_{ID}^{RS})$ value. The sidelink synchronization ID refers to an ID used at the time of synchronization in the sidelink.

Method 5 is a combination of the above methods 1 to 4. If the number of bits used in Methods 1 to 4 is 16 bits or less, a combination of the different methods may be considered when the number of bits of $N_{ID}^{nSCID}$ does not exceed 16 bits even in the combination of the different methods. For example, in the case where the method 2 (destination ID) and the method 3 (source ID) are combined, assuming that the destination ID is 4-bit information, and the source ID is also 4-bit information, $N_{ID}^{nSCID}$ may be determined in a combination of destination ID+source ID or source ID+destination ID. Through such a combination, it may be possible to further randomize the DMRS sequence.

In the above method, if the number of bits of $N_{ID}^{nSCID}$ in Methods 1 to 5 does not exceed 16 bits, it can be considered that the latter bits are zero padded. If one of the above methods is used, the UE may assume this and receive the DMRS for the PSSCH.

According to an embodiment, a method in which a transmission UE indicates information on a DMRS port for a PSSCH in a sidelink is provided. Specifically, signaling information may be determined by the following four (4) conditions.

Condition 1 is a maximum number of orthogonal DMRS ports supported for single user MIMO (SU-MIMO) per UE. A method of indicating a DMRS port may vary according to Condition 1.

Condition 2 is a maximum orthogonal DMRS ports supported for multi-user MIMO (MU-MIMO) per UE. A method of indicating a DMRS port may vary by Condition 2.

Condition 3 is a used DMRS configuration type. A method of indicating a DMRS port may vary by Condition 3. In this case, for example, the DMRS pattern type 1 or the DMRS pattern type 2 may be used as the DMRS configuration type of the Condition 3. However, the embodiment of the disclosure is not limited thereto. The number of patterns to be used may vary. For example, the DMRS pattern type 1 may refer to the description with reference to 1d-10 of FIG. 1D.

In addition, the DMRS pattern type 2 may refer to the description with reference to 1d-20 of FIG. 1D. However, pattern types 1 and 2 are not limited to 1d-10 and 1d-20, and various DMRS patterns (for example, patterns configured or predefined by the gNB) may be used. Alternatively, it may be assumed that the one-symbol pattern among the DMRS patterns described with reference to FIG. 1D is used.

Condition 4 is whether to indicate a number of DMRS CDM groups. A method of indicating the DMRS port may vary by Condition 4. If the number of CDM groups is 1, the ratio of PSSCH energy per resource element (EPRE) to DMRS EPRE may be assumed to be a predetermined value or a configured value (for example, 0 dB). If the number of CDM groups is 2, the ratio of PSSCH EPRE to DMRS EPRE may be assumed to be a predetermined value or a configured value (for example, −3 dB). If the number of CDM groups is 3, the ratio of PSSCH EPRE to DMRS EPRE may be assumed to be a predetermined value or a configured value (for example, −4.77 dB). In addition, if the number of DMRS CDM groups is indicated, a reception UE may emulate MU interference at the time of MU-MIMO support.

In this case, information for indicating a DMRS port may be determined based on at least one of Conditions 1 to 4, above. An example of a specific method of indicating a DMRS port is as follows.

When the condition is Condition 1 (2 ports)+Condition 2 (1 port)+Condition 3 (type 2)+Condition 4 (indicated), as the method of indicating the DMRS port, Table 8, below, may indicate SCI, and thus DMRS port-related information (e.g., a DMRS port number, a number of DMRS ports, and a number of CDM groups) may be indicated.

TABLE 8

| Value | Number of DMRS CDM group(s) without data | DMRS port(s) |
| --- | --- | --- |
| 0 | 1 | 0 |
| 1 | 1 | 1 |
| 2 | 2 | 0 |
| 3 | 2 | 1 |
| 4 | 2 | 2 |
| 5 | 2 | 3 |
| 6 | 3 | 0 |
| 7 | 3 | 1 |
| 8 | 3 | 2 |
| 9 | 3 | 3 |
| 10 | 3 | 4 |
| 11 | 3 | 5 |
| 12 | 1 | 0, 1 |
| 13 | 2 | 0, 1 |
| 14 | 3 | 0, 1 |
| 15 | Reserved | Reserved |

When the condition is condition 1 (2 ports)+condition 2 (0 ports)+condition 3 (type 2)+condition 4 (indicated), as the method of indicating the DMRS port, Table 9, below, may indicate SCI, and thus DMRS port-related information may be indicated.

TABLE 9

| Value | Number of DMRS CDM group(s) without data | DMRS port(s) |
| --- | --- | --- |
| 0 | 1 | 0 |
| 1 | 2 | 0 |
| 2 | 3 | 0 |
| 3 | 1 | 0, 1 |
| 4 | 2 | 0, 1 |
| 5 | 3 | 0, 1 |
| 6-7 | Reserved | Reserved |

When the condition is Condition 1 (2 ports)+Condition 2 (1 port)+Condition 3 (type 2)+Condition 4 (not indicated), as the method of indicating the DMRS port, Table 10, below, may indicate SCI, and thus DMRS port-related information may be indicated.

TABLE 10

| Value | DMRS port(s) |
|---|---|
| 0 | 0 |
| 1 | 1 |
| 2 | 2 |
| 3 | 3 |
| 4 | 4 |
| 5 | 5 |
| 6 | 0, 1 |
| 7 | Reserved |

When the condition is Condition 1 (2 ports)+Condition 2 (0 ports)+Condition 3 (type 2)+Condition 4 (not indicated), as the method of indicating the DMRS port, Table 11, below, may indicate SCI, and thus DMRS port-related information may be indicated.

TABLE 11

| Value | DMRS port(s) |
|---|---|
| 0 | 0 |
| 1 | 0, 1 |

When the condition is Condition 1 (4 ports)+Condition 2 (2 ports)+Condition 3 (type 2)+Condition 4 (indicated), as the method of indicating the DMRS port, Table 12-1, below, may indicate SCI, and thus DMRS port-related information may be indicated.

TABLE 12-1

| Value | Number of DMRS CDM group(s) without data | DMRS port(s) |
|---|---|---|
| 0 | 1 | 0 |
| 1 | 1 | 1 |
| 2 | 1 | 0, 1 |
| 3 | 2 | 0 |
| 4 | 2 | 1 |
| 5 | 2 | 2 |
| 6 | 2 | 3 |
| 7 | 2 | 0, 1 |
| 8 | 2 | 2, 3 |
| 9 | 2 | 0-2 |
| 10 | 2 | 0-3 |
| 11 | 3 | 0 |
| 12 | 3 | 1 |
| 13 | 3 | 2 |
| 14 | 3 | 3 |
| 15 | 3 | 0, 1 |
| 16 | 3 | 2, 3 |
| 17 | 3 | 0-3 |
| 18-31 | Reserved | Reserved |

By minimizing unnecessary signaling in Table 12-1, a 4 bit-table can be used as shown in Table 12-2, below.

TABLE 12-2

| Value | Number of DMRS CDM group(s) without data | DMRS port(s) |
|---|---|---|
| 0 | 1 | 0 |
| 1 | 1 | 1 |
| 2 | 1 | 0, 1 |
| 3 | 2 | 0 |
| 4 | 2 | 1 |
| 5 | 2 | 2 |
| 6 | 2 | 3 |
| 7 | 2 | 0, 1 |
| 8 | 2 | 2, 3 |
| 9 | 2 | 0-2 |
| 10 | 2 | 0-3 |
| 11 | 3 | 0 |
| 12 | 3 | 1 |
| 13 | 3 | 2 |
| 14 | 3 | 3 |
| 15 | 3 | 0-3 |

When the condition is Condition 1 (4 ports)+Condition 2 (1 port)+Condition 3 (type 2)+Condition 4 (indicated), as the method of indicating the DMRS port, Table 13, below, may indicate SCI, and thus DMRS port-related information may be indicated.

TABLE 13

| Value | Number of DMRS CDM group(s) without data | DMRS port(s) |
|---|---|---|
| 0 | 1 | 0 |
| 1 | 1 | 1 |
| 2 | 1 | 0, 1 |
| 3 | 2 | 0 |
| 4 | 2 | 1 |
| 5 | 2 | 2 |
| 6 | 2 | 3 |
| 7 | 2 | 0-2 |
| 8 | 2 | 0-3 |
| 9 | 3 | 0 |
| 10 | 3 | 1 |
| 11 | 3 | 2 |
| 12 | 3 | 3 |
| 13 | 3 | 0-3 |
| 14-15 | Reserved | Reserved |

When the condition is Condition 1 (4 ports)+Condition 2 (2 ports)+Condition 3 (type 2)+Condition 4 (not indicated), as the method of indicating the DMRS port, Table 14, below, may indicate SCI, and thus DMRS port-related information may be indicated.

TABLE 14

| Value | DMRS port(s) |
|---|---|
| 0 | 0 |
| 1 | 1 |
| 2 | 2 |
| 3 | 3 |
| 4 | 0, 1 |
| 5 | 2, 3 |
| 6 | 0-2 |
| 7 | 0-3 |

When the condition is Condition 1 (4 ports)+Condition 2 (1 ports)+Condition 3 (type 2)+Condition 4 (not indicated), as the method of indicating the DMRS port, Table 15, below, may indicate SCI, and thus DMRS port-related information may be indicated.

TABLE 15

| Value | DMRS port(s) |
|---|---|
| 0 | 0 |
| 1 | 1 |
| 2 | 2 |
| 3 | 3 |
| 4 | 0-2 |

TABLE 15-continued

| Value | DMRS port(s) |
|---|---|
| 5 | 0-3 |
| 6-7 | Reserved |

When the condition is Condition 1 (2 ports)+Condition 2 (1 port)+Condition 3 (type 1)+Condition 4 (indicated), as the method of indicating the DMRS port, Table 16, below, may indicate SCI, and thus DMRS port-related information may be indicated.

TABLE 16

| Value | Number of DMRS CDM group(s) without data | DMRS port(s) |
|---|---|---|
| 0 | 1 | 0 |
| 1 | 1 | 1 |
| 2 | 1 | 0, 1 |
| 3 | 2 | 0 |
| 4 | 2 | 1 |
| 5 | 2 | 0, 1 |
| 6-7 | Reserved | Reserved |

When the condition is Condition 1 (2 ports)+Condition 2 (0 ports)+Condition 3 (type 1)+Condition 4 (indicated), as the method of indicating the DMRS port, Table 17, below, may indicate SCI, and thus DMRS port-related information may be indicated.

TABLE 17

| Value | Number of DMRS CDM group(s) without data | DMRS port(s) |
|---|---|---|
| 0 | 1 | 0 |
| 1 | 1 | 0, 1 |
| 2 | 2 | 0 |
| 3 | 2 | 0, 1 |

When the condition is Condition 1 (2 ports)+Condition 2 (1 port)+Condition 3 (type 1)+Condition 4 (not indicated), as the method of indicating the DMRS port, Table 18, below, may indicate SCI, and thus DMRS port-related information may be indicated.

TABLE 18

| Value | DMRS port(s) |
|---|---|
| 0 | 0 |
| 1 | 1 |
| 2 | 0, 1 |
| 3 | Reserved |

When the condition is Condition 1 (2 ports)+Condition 2 (0 ports)+Condition 3 (type 1)+Condition 4 (not indicated), as the method of indicating the DMRS port, Table 19, below, may indicate SCI, and thus DMRS port-related information may be indicated.

TABLE 19

| Value | DMRS port(s) |
|---|---|
| 0 | 0 |
| 1 | 0, 1 |

When the condition is Condition 1 (4 ports)+Condition 2 (2 ports)+Condition 3 (type 1)+Condition 4 (indicated), as the method of indicating the DMRS port, Table 20, below, may indicate SCI, and thus DMRS port-related information may be indicated.

TABLE 20

| Value | Number of DMRS CDM group(s) without data | DMRS port(s) |
|---|---|---|
| 0 | 1 | 0 |
| 1 | 1 | 1 |
| 2 | 1 | 0, 1 |
| 3 | 2 | 0 |
| 4 | 2 | 1 |
| 5 | 2 | 2 |
| 6 | 2 | 3 |
| 7 | 2 | 0, 1 |
| 8 | 2 | 2, 3 |
| 9 | 2 | 0-2 |
| 10 | 2 | 0-3 |
| 11-15 | Reserved | Reserved |

When the condition is Condition 1 (4 ports)+Condition 2 (1 port)+Condition 3 (type 1)+Condition 4 (indicated), as the method of indicating the DMRS port, Table 21, below, may indicate SCI, and thus DMRS port-related information may be indicated.

TABLE 21

| Value | Number of DMRS CDM group(s) without data | DMRS port(s) |
|---|---|---|
| 0 | 1 | 0 |
| 1 | 1 | 1 |
| 2 | 1 | 0, 1 |
| 3 | 2 | 0 |
| 4 | 2 | 1 |
| 5 | 2 | 2 |
| 6 | 2 | 3 |
| 7 | 2 | 0, 1 |
| 8 | 2 | 0-2 |
| 9 | 2 | 0-3 |
| 10-15 | Reserved | Reserved |

When the condition is Condition 1 (4 ports)+Condition 2 (2 ports)+Condition 3 (type 1)+Condition 4 (not indicated), as the method of indicating the DMRS port, Table 22, below, may indicate SCI, and thus DMRS port-related information may be indicated.

TABLE 22

| Value | DMRS port(s) |
|---|---|
| 0 | 0 |
| 1 | 1 |
| 2 | 2 |
| 3 | 3 |
| 4 | 0, 1 |
| 5 | 2, 3 |
| 6 | 0-2 |
| 7 | 0-3 |

When the condition is Condition 1 (4 ports)+Condition 2 (1 port)+Condition 3 (type 1)+Condition 4 (not indicated), as the method of indicating the DMRS port, Table 23, below, may indicate SCI, and thus DMRS port-related information may be indicated.

TABLE 23

| Value | DMRS port(s) |
|---|---|
| 0 | 0 |
| 1 | 1 |
| 2 | 2 |
| 3 | 3 |
| 4 | 0, 1 |
| 5 | 0-2 |
| 6 | 0-3 |
| 7 | Reserved |

The method for indicating the DMRS port information for the PSSCH disclosed in this embodiment is distinguished from the method in an existing communication system based on at least one of whether to support the maximum number of orthogonal DMRS ports to be supported for SU-MIMO per UE supported in a sidelink; whether to support the maximum number of orthogonal DMRS ports to be supported for MU-MIMO per UE; whether to support the used DMRS configuration type; and whether to support the number of DMRS CDM groups. In addition, a method of minimizing unnecessary signaling may be used to minimize the signaling overhead. Also, the indexing orders may be modified for each of the signaling tables.

According to an embodiment, an additional method for inserting a preamble according to the subcarrier spacing is provided. As described above, the following has been disclosed as a method of configuring a preamble in order to efficiently perform AGC in the NR sidelink communication system.

As described above, preambles are not inserted for subcarrier spacings corresponding to 15 kHz/30 kHz. For the subcarrier spacing corresponding to 60 kHz, a one-symbol length preamble is inserted. For the subcarrier spacing corresponding to 120 kHz, a two-symbol length preamble may be inserted or a one-symbol length preamble may be inserted in consideration of the preamble overhead in the same manner as in 60 kHz.

Thus, it was assumed that a time interval required for AGC was 15 usec. However, since an increased time interval may be required, an example of a method of configuring a preamble in another time interval will be described below.

According to a first method, a preamble is not inserted for the subcarrier spacing corresponding to 15 kHz. For the subcarrier spacing corresponding to 30 kHz, a one-symbol length preamble is inserted. For the subcarrier spacing corresponding to 60 kHz and 120 kHz, a two-symbol length preamble is inserted. This method has been disclosed on the assumption that the time interval required for AGC is required to be 35 μsec for all subcarrier spacing.

According to a second method, for subcarrier spacings corresponding to 15 kHz and 30 kHz, a one-symbol length preamble is inserted. For the subcarrier spacings corresponding to 60 kHz and 120 kHz, a two-symbol length preamble is inserted.

In the second method, the preamble is always transmitted in the AGC region. When this method is used, it may be helpful to perform sensing, such as listen before talk (LBT), in a mode in which a UE directly performs sensing in the sidelink to select resources.

More specifically, since the preamble is always transmitted in the AGC region, the UE may determine whether a corresponding channel is idle or busy by performing energy detection on the preamble in this region. In this case, when the channel is idle, it is determined that the channel is not occupied by another UE. When the channel is busy, it is determined that the channel is occupied by another UE.

When the preamble is transmitted in the AGC region by the second method, it means that control information and data are transmitted in the next slot. On the contrary, according to Method-2, described above, the control information and data are transmitted in a corresponding slot. Therefore, when using the second method, it can be very important to select resources by performing sensing in the sidelink.

The preamble refers to a signal transmitted by a UE transmitting the control and data signals so that a UE receiving control and data signals performs AGC. A method in which a preamble is inserted (preamble length and positioning) according to the subcarrier spacing is not limited to the methods described above.

Figure 1L:
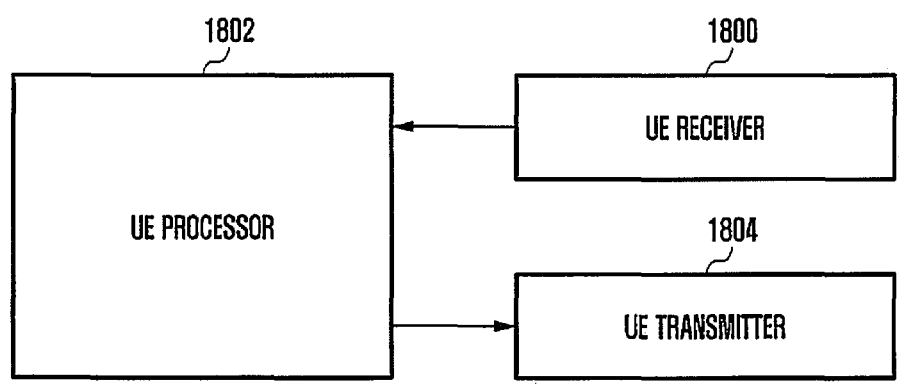
FIG. 1L is a block diagram illustrating an internal structure of a UE, according to an embodiment.
Figure 1M:
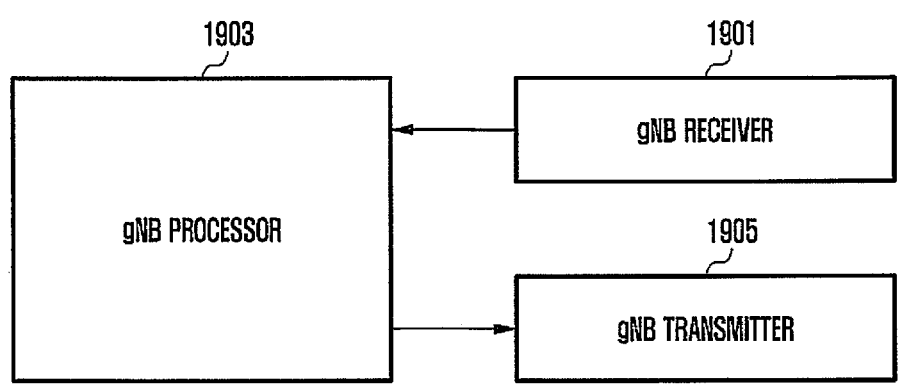
FIG. 1M is a block diagram illustrating an internal structure of a gNB, according to an embodiment.

In order to carry out the above embodiments of the disclosure, a transmitter, a receiver, and a processor of each of a UE and a gNB are illustrated in FIGS. 1L and 1M, respectively.

In order to perform a method of performing AGC in a V2X system and a reference signal configuration method, the receiver, the processor, and the transmitter of the gNB and the UE should operate according to the above-described embodiments.

Specifically, FIG. 1L is a block diagram illustrating an internal structure of a UE, according to an embodiment.

As shown in FIG. 1L, a UE includes a UE receiver 1800, a UE transmitter 1804, and a UE processor 1802.

The UE receiver 1800 and the UE transmitter 1804 may collectively be referred to as a transceiver. The transceiver may transmit and receive a signal to and from a gNB. The signal may include control information and data. To this end, the transceiver may include an RF transmitter for up-converting and amplifying the frequency of a transmitted signal and an RF receiver for low-noise amplifying a received signal and down-converting a frequency. In addition, the transceiver may receive a signal through a wireless channel, output the signal to the UE processor 1802, and transmit a signal output from the UE processor 1802 through a wireless channel.

The UE processor 1802 may control a series of processes to operate the UE according to the above-described embodiment of the disclosure. The UE processor 1802 may be referred to as a controller, and the controller may be defined as a circuit, an application specific integrated circuit (ASIC), or at least one processor.

FIG. 1M is a block diagram illustrating an internal structure of a GNB, according to an embodiment.

As shown in FIG. 1M, a gNB of the disclosure may include a gNB receiver 1901, a gNB transmitter 1905, and a gNB processor 1903.

The gNB receiver 1901 and the gNB transmitter 1905 collectively be referred to as a transceiver. The transceiver may transmit and receive a signal to and from a UE. The signal may include control information and data. To this end, the transceiver may include an RF transmitter for up-converting and amplifying the frequency of a transmitted signal and an RF receiver for low-noise amplifying and down-converting a received signal. In addition, the transceiver may receive a signal through a wireless channel, may output the signal to the gNB processor 1903, and may transmit the signal output from the gNB processor 1903 through a wireless channel.

The gNB processor 1903 may control a series of processes to operate the gNB. The gNB processor 1903 may be referred to as a controller, and the controller may be defined as a circuit, an ASIC, or at least one processor.

Another embodiment of the disclosure describes a method of determining an AGC in a sidelink, a transmission position of a PSCCH according to the AGC, and a DMRS transmission position for a PSSCH. As described with reference to FIG. 1H, a symbol region for AGC may be required before transmitting control and data information in the sidelink. The following alternatives may be considered for the transmission position of the PSCCH in the sidelink.

Alternative 1: PSCCH is located at first sidelink symbol of slot

Alternative 2: PSCCH is located at second sidelink symbol of slot

Alternative 3: PSCCH is located at third sidelink symbol of slot

Figure 2:
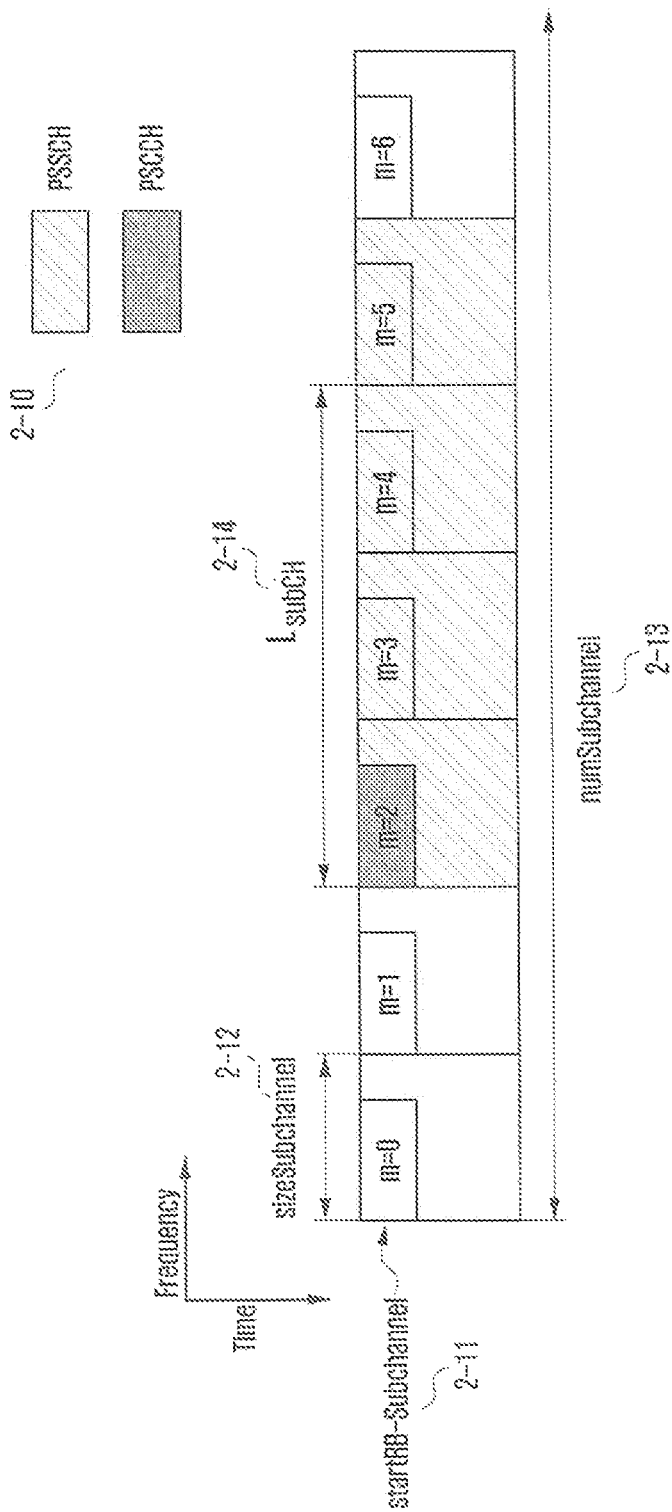
FIG. 2 illustrates a case in which four subchannels are allocated to a PSSCH starting from a third subchannel.

In the above description, the "side link symbol" refers to a symbol used as a sidelink in a slot. Note that all symbols in the slot may be used for sidelink transmission and only some of the slots may be used for sidelink transmission. In the disclosure, it is specified that a position in time assumed for sidelink transmission is determined on the basis of a sidelink symbol. In addition, a symbol length X of a PSCCH may be pre-configured for each TX/RX resource pool. For example, $X \in \{2,3\}$ may be configured to a possible length of X. In addition, a position in frequency of the PSCCH may be transmitted only in one subchannel among the subchannels in which the PSSCH is scheduled as shown in FIG. 2 and may be mapped and transmitted starting from the lowest PRB in frequency. The starting position (startRB-Subchannel, 2-11) of the subchannel, the size of the subchannel (sizeSubchannel, 2-12), and the number of subchannels (numSubchannel, 2-13) can be configured in the resource pool. The length LsubCH (2-14) to which the PSSCH is allocated may be determined in the configured resource pool information in frequency. FIG. 2 illustrates a case in which four subchannels (LsubCHs) are allocated to a PSSCH starting from a third subchannel based on low subchannels in frequency of a subchannel configured as a resource pool. In this case, an example in which the PSCCH is mapped from the lowest PRB in frequency in a region where the PSSCH is allocated and is transmitted in one subchannel is shown. This embodiment describes a method of determining a DMRS transmission position for the PSSCH for the above-mentioned three alternatives. Note that the disclosure is not limited to the DMRS positions presented below. Even if the detailed position where the DMRS is transmitted is changed, a method of determining the transmission position of the DMRS can be applied regardless of the detailed DMRS position, according to a UE speed limited by the disclosure, the Configured number of DMRS symbols, and the number of subchannels allocated to the PSSCH, regardless of the detailed DMRS location.

First, the alternative 1 is a method in which a symbol region for AGC is not considered separately in a case in which a PSCCH is positioned in a first sidelink symbol of a slot. An example of the PSCCH position for the alternative 1 is shown as 3-20 in FIG. 3A. Therefore, when the corresponding method is used, there is a disadvantage that a performance degradation of PSCCH reception may occur. However, in a case in which this method is considered, when the symbol length of the PSCCH is 3 or less, the PDCCH DMRS transmission position in the NR Uu system can be reused as it is. More specifically, a method of supporting a DMRS pattern in time for a PSSCH will be described below.

[Method of Supporting DMRS Pattern in Time for PSSCH]

In Table 24 and Table 25 below, the position of the DMRS is based on the first symbol used for the sidelink.

The DMRS pattern for the PSSCH is defined as a single-symbol DMRS.

In d-10 and d-30, two types of patterns in frequency for the single-symbol DMRS for PSSCH are shown. A DMRS type A (d-10) is a type that supports up to four orthogonal DMRS ports with a cyclic shift (CS) length 2 structure in Comb 2 structure. A DMRS type B (d-30) is a structure in which an orthogonal cover codes (OCC) is applied in two REs adjacent to a frequency axis and an FDM is applied to support up to six orthogonal DMRS ports. Both patterns may be used in the sidelink, or only one of the two types of patterns may be selected and supported. If both two patterns are supported, the configuration for the two patterns may be pre-configured in the resource pool. Alternatively, it may be dynamically indicated through an SCI.

The DMRS pattern in time for the PSSCH can be determined by a method in which the single-symbol DMRS is transmitted within a symbol interval where the PSSCH is transmitted, and whether a single fixed DMRS pattern is used for the resource pool configuration or a plurality of DMRS patterns in time are used can be pre-configured.

If the fixed DMRS pattern is configured to be used for the resource pool configuration, the DMRS pattern in time in a PSSCH region may be determined as a DMRS pattern corresponding to dmrs-AdditionalPosition=3 by a "duration in sidelink symbol" based on Table 24 in consideration of a high-speed transmission environment of the sidelink. If dmrs-AdditionalPosition is 0, 1, 2, and 3, it indicates that the DMRS is transmitted with 1, 2, 3, and 4 symbols, respectively.

If the plurality of DMRS patterns is used for the resource pool configuration, the UE may select the corresponding pattern. In addition, the information of the selected pattern may be informed to other UEs by SCI. In this case, the selectable DMRS pattern in time may be "dmrs-AdditionalPosition" based on Table 24. The actually transmitted DMRS pattern in time is determined by "duration in sidelink symbol" and the selected "dmrs-AdditionalPosition" based on Table 24.

TABLE 24

| duration in sidelink symbol | dmrs-AdditionalPosition | | | |
|---|---|---|---|---|
| | 0 | 1 | 2 | 3 |
| 2 | — | — | — | — |
| 3 | $l_0$ | $l_0$ | $l_0$ | $l_0$ |
| 4 | $l_0$ | $l_0$ | $l_0$ | $l_0$ |
| 5 | $l_0$ | $l_0$ | $l_0$ | $l_0$ |
| 6 | $l_0$ | $l_0$ | $l_0$ | $l_0$ |
| 7 | $l_0$ | $l_0$ | $l_0$ | $l_0$ |
| 8 | $l_0$ | $l_0$, 7 | $l_0$, 7 | $l_0$, 7 |
| 9 | $l_0$ | $l_0$, 7 | $l_0$, 7 | $l_0$, 7 |
| 10 | $l_0$ | $l_0$, 9 | $l_0$, 6, 9 | $l_0$, 6, 9 |
| 11 | $l_0$ | $l_0$, 9 | $l_0$, 6, 9 | $l_0$, 6, 9 |
| 12 | $l_0$ | $l_0$, 9 | $l_0$, 6, 9 | $l_0$, 5, 8, 11 |
| 13 | $l_0$ | $l_0$, 11 | $l_0$, 7, 11 | $l_0$, 5, 8, 11 |
| 14 | $l_0$ | $l_0$, 11 | $l_0$, 7, 11 | $l_0$, 5, 8, 11 |

In Table 24, the value of $l_0$ may be used as one fixed value or may be determined according to the PSCCH symbol length. For example, if the value of $l_0$ is fixed, $l_0$ may be 3.

Figure 3A:
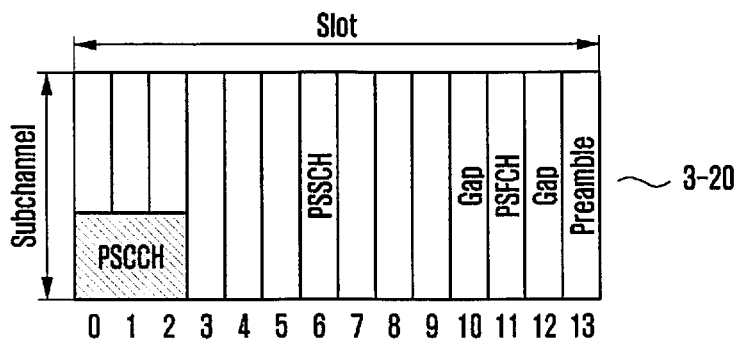
FIGS. 3A to 3E illustrate a transmission position of the PSCCH in the sidelink.
Figure 3A:
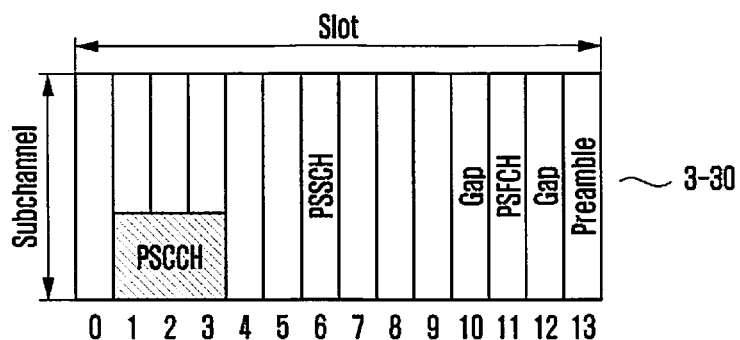
Figure 3A:
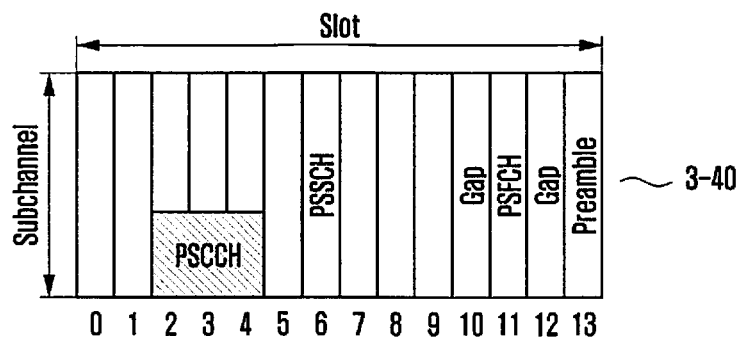
Figure 3B:
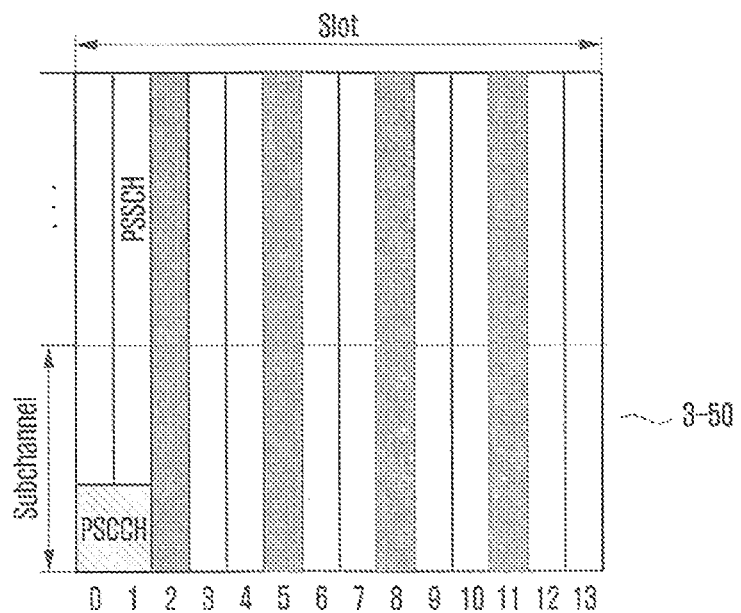
Figure 3B:
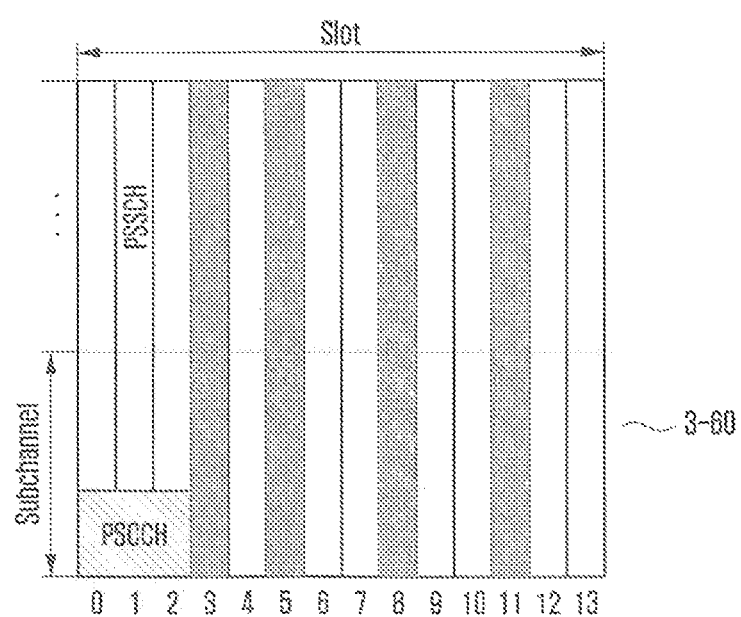

Unlike this, when the value of $l_0$ is determined according to the PSCCH symbol length, the value of $l_0$ may be preconfigured in the resource pool as 2 or 3. Unlike this, if the PSCCH symbol length in which the resource pool is configured is 2, the value of $l_0$ is determined as 2, or if the PSCCH symbol length in which the resource pool is configured is 3, the value of 1 is determined as 3. 3-50 in FIG. 3B illustrates an example in which the value of $l_0$ is configured as 2 and four DMRS symbols are transmitted according to Table 24. In FIG. 3B, 3-60 in FIG. 3B illustrates an example in which the value of $l_0$ is configured as 3 and four DMRS symbols are transmitted according to Table 24.

Next, the alternative 2 is a method in which one symbol region for AGC is considered in a case in which a PSCCH is positioned in a second sidelink symbol of a slot. In FIG. 3A, an example of the PSCCH position for the alternative 2 is shown as 3-30. At this time, as to the use of the first sidelink symbol, the following methods may be considered.

Method 1: PSSCH is transmitted
Method 2: Preamble for AGC is transmitted
Method 3: PSCCH transmitted in second sidelink symbol is copied and transmitted In case of the alternative 2, unlike the alternative 1, the PDCCH DMRS transmission position in the NR Uu system cannot be reused as it is. Specifically, since the first symbol of the sidelink is considered as the symbol for AGC, when the PSCCH has a maximum length of three symbols, a first PSSCH DMRS position should be located after the PSCCH symbol. More specifically, even when the method 1 is used, the PSSCH DMRS cannot be transmitted in the sidelink first symbol. This is because, when the PSSCH DMRS is transmitted to the symbol region used in consideration of the AGC, distortion may occur in DMRS channel estimation and thus the PSSCH decoding performance may be degraded. Therefore, when the alternative 2 is considered, Table 25 below may be used instead of Table 24 in the above-described method of supporting DMRS pattern in time for PSSCH. However, the disclosure is not limited only to the DMRS position of Table 25.

TABLE 25

| duration in sidelink symbol | dmrs-AdditionalPosition | | | |
|---|---|---|---|---|
| | 0 | 1 | 2 | 3 |
| 2 | — | — | — | — |
| 3 | $l_0$ | $l_0$ | $l_0$ | $l_0$ |
| 4 | $l_0$ | $l_0$ | $l_0$ | $l_0$ |
| 5 | $l_0$ | $l_0$ | $l_0$ | $l_0$ |
| 6 | $l_0$ | $l_0$ | $l_0$ | $l_0$ |
| 7 | $l_0$ | $l_0$ | $l_0$ | $l_0$ |
| 8 | $l_0$ | $l_0$, 8 | $l_0$, 8 | $l_0$, 8 |
| 9 | $l_0$ | $l_0$, 8 | $l_0$, 8 | $l_0$, 8 |
| 10 | $l_0$ | $l_0$, 10 | $l_0$, 7, 10 | $l_0$, 7, 10 |
| 11 | $l_0$ | $l_0$, 10 | $l_0$, 7, 10 | $l_0$, 7, 10 |
| 12 | $l_0$ | $l_0$, 10 | $l_0$, 7, 10 | $l_0$, 6, 9, 12 |
| 13 | $l_0$ | $l_0$, 12 | $l_0$, 8, 12 | $l_0$, 6, 9, 12 |
| 14 | $l_0$ | $l_0$, 12 | $l_0$, 8, 12 | $l_0$, 6, 9, 12 |

Figure 3C:
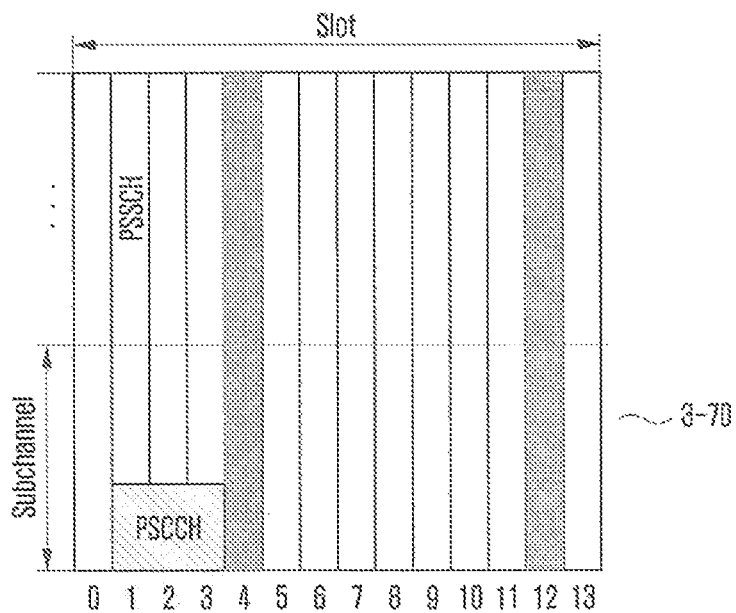
Figure 3C:
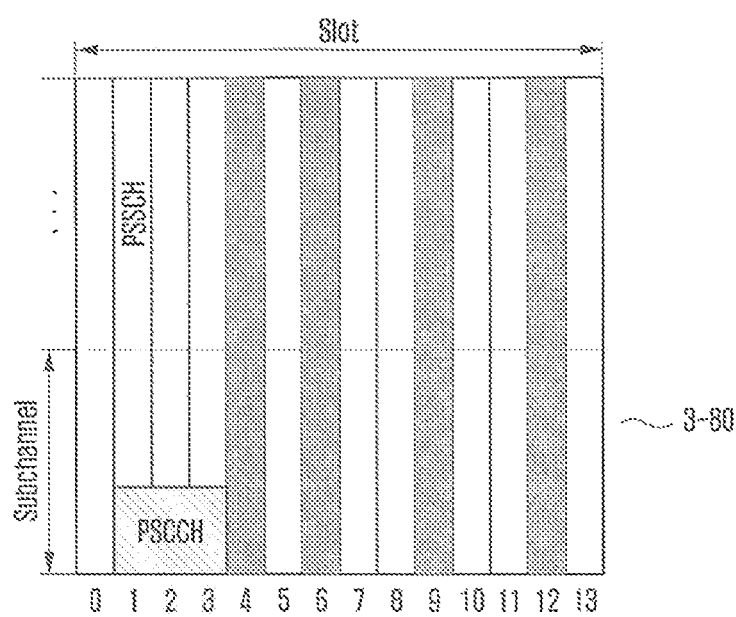
Figure 3D:
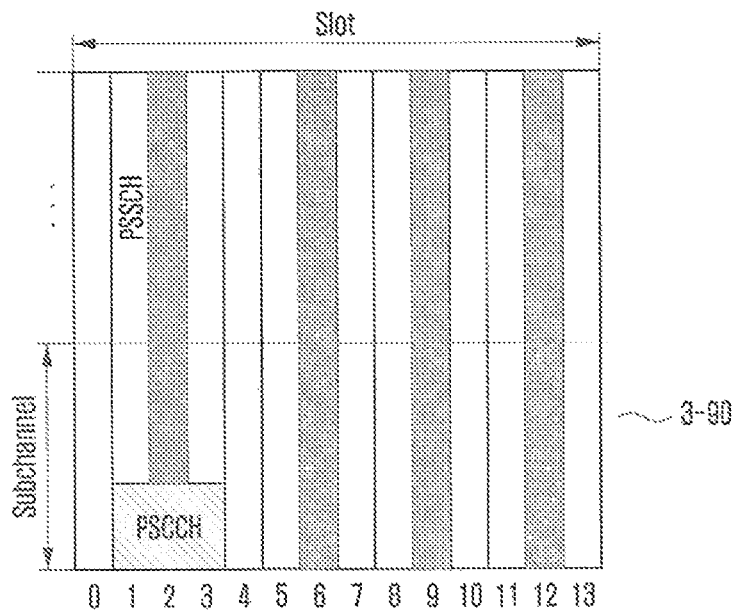
Figure 3D:
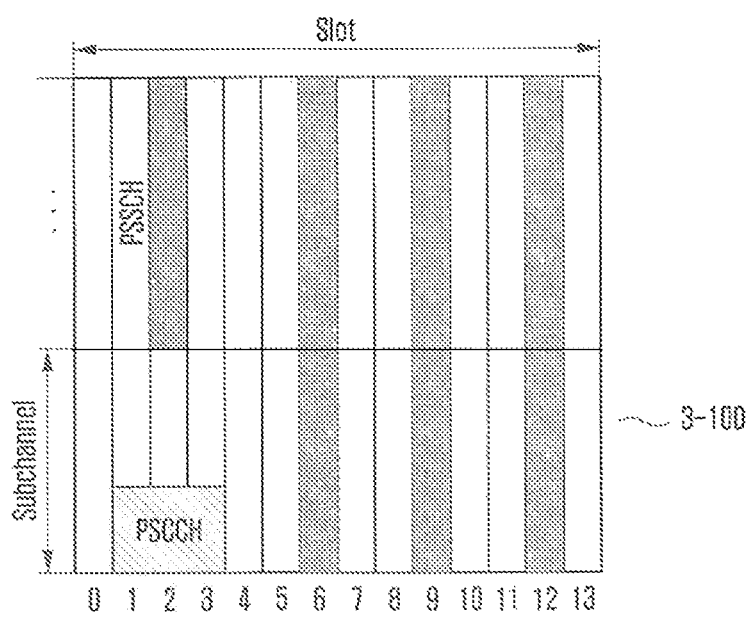

In Table 25, the value of $l_0$ may be used as one fixed value or may be determined according to the PSCCH symbol length. For example, if the value of $l_0$ is fixed, $l_0$ may be 4. Unlike this, when the value of $l_0$ is determined according to the PSCCH symbol length, the value of $l_0$ may be preconfigured in the resource pool as 3 or 4. Unlike this, when the PSCCH symbol length in which the resource pool is configured is 2, the value of $l_0$ is determined as 3, and when the PSCCH symbol length in which the resource pool is configured is 3, the value of $l_0$ is determined as 4. 3-70 in FIG. 3C illustrates an example in which the value of $l_0$ is configured as 4 and two DMRS symbols are transmitted according to Table 25. 3-80 in FIG. 3C illustrates an example in which the value of $l_0$ is configured as 4 and four DMRS symbols are transmitted according to Table 25. However, considering only a case where the PSSCH DMRS is always transmitted after a region in which the PSCCH in time is transmitted, in the alternative 2 compared to the alternative 1, the last symbol of the PSCCH is pushed back by one symbol, and therefore, if a channel changes rapidly over time, the accuracy of channel estimation of the PSSCH located in the front region of the first PSSCH DMRS may be degraded. Therefore, when one or more of the following conditions are satisfied, the PSSCH DMRS may overlap the region where the PSCCH in time is transmitted and may be transmitted in another frequency domain. In the disclosure, the following conditions are not limited to the alternative 2.

[Conditions that PSSCH DMRS Symbol Overlaps with Region where PSCCH in Time is Transmitted and is Transmitted in Another Frequency Domain]

Condition 1: UE speed (absolute speed of TX UE or relative speed between TX/RX UEs) is greater than or equal to A Condition 2: configured number of DMRS symbols is greater than or equal to B Condition 3: number of subchannels allocated by PSSCH is greater than or equal to C First, condition 1 may be a valid condition because the channel changes rapidly over time when the UE speed is high. For example, the corresponding condition may be established when the corresponding speed is A km/h or more. Next, condition 2 may be a valid condition because a large number of DMRS symbols are configured when the channel changes rapidly over time. For example, when the number of DMRS symbols is configured as 4 (when dmrs-AdditionalPosition=3 in Table 24 and Table 25), the corresponding condition may be established. In addition, since the PSSCH region located in the front region of the first PSSCH DMRS increases along with an increase in the number of subchannels allocated by the PSSCH, the corresponding condition may be a valid condition. For example, when the number of subchannels allocated by the PSSCH is C or more, the corresponding condition may be established. However, the disclosure is not limited only to the above conditions. Also, when one or more of the above conditions are satisfied, a method of allowing the PSSCH DMRS to overlap the region where the PSCCH in time is transmitted and to be transmitted in other frequency domains can be considered. For example, the method may be used if the condition 2 and condition 3 are simultaneously satisfied. Two methods in which the PSSCH DMRS is transmitted before the time domain in which the PSCCH is transmitted are illustrated 3-90 and 3-100 in FIG. 3D. First, as shown as 3-90 in FIG. 3D, as the first method, an example in which the value of $l_0$ is configured as 2 and four DMRS symbols are transmitted is shown. The first method is a method in which the PSSCH DMRS is allowed to be transmitted in all frequency domains in which the PSCCH is not transmitted when the PSSCH DMRS overlaps with the region where the PSCCH in time is transmitted and is transmitted in other frequency domains. Specifically, as shown 3-90 in FIG. 3D, even when the PSCCH is mapped to all PRBs in one subchannel and is not transmitted, the PSSCH DMRS may overlap the region where the PSCCH in time is transmitted in the remaining frequency domains. Unlike this, as the second method, as shown 3-100 in FIG. 3D, an example in which the value of $l_0$ is configured as 2 according to Table 25 and four DMRS symbols are transmitted is shown. The second method is a method in which the PSSCH DMRS is allowed to be transmitted in all frequency domains of another subchannel in which the PSCCH is not transmitted when the PSSCH DMRS overlaps with the region where the PSCCH in time is transmitted and is transmitted in other frequency domains.

In Table 24 and Table 25, a method in which the first DMRS symbol (Front-loaded DMRS) $l_0$ of the PSSCH DMRS is determined on the basis of the first symbol used in the sidelink and the value of $l_0$ is fixed or configured according to the PSCCH symbol length has been described. At this time, the position of the first DMRS symbol $l_0$ of the PSSCH DMRS may be fixed or configured to always be located behind the PSCCH symbol in consideration of the PSCCH symbol length. Unlink this, the position of the first DMRS symbol $l_0$ of the PSSCH DMRS may be determined in such a manner that the PSSCH DMRS symbol overlaps with the region where the PSCCH in time is transmitted and is transmitted in other frequency domains. In addition, as described above, the PSSCH DMRS symbol may be allowed to overlap with the region in which the PSCCH in time is transmitted and to be transmitted in other frequency domains only when one or more of the above conditions are satisfied. If the PSSCH DMRS symbol overlaps the region in which the PSCCH in time is transmitted and is transmitted in other frequency domains, one or more PSSCH DMRS symbols may overlap the region where the PSCCH in time is transmitted, according to the length of the PSCCH, the position of the first DMRS symbol $l_0$ of the PSSCH DMRS, and the position of the next DMRS symbol. It may overlap with the region in which the PSCCH is transmitted in time. Note that the disclosure is not limited to the PSSCH DMRS position configuration method in Tables X and Y. In general, the PSSCH DMRS symbol position may be determined to always be located after the PSCCH in time. Alternatively, the PSSCH DMRS symbol position may overlap the region where the PSCCH in time is transmitted and may be configured in other frequency domains. In the latter case, the following three methods can be considered.

PSSCH DMRS transmission of the overlapping region is not allowed, and the PSSCH DMRS of the corresponding region is punctured (or rate-matched).

PSSCH DMRS transmission of the overlapping region is allowed and the PSSCH DMRS is transmitted.

PSSCH DMRS transmission of the overlapped region is allowed when the proposed condition [the PSSCH DMRS symbol overlaps the region where the PSCCH in time is transmitted and is transmitted in other frequency domains] is satisfied.

Figure 3E:
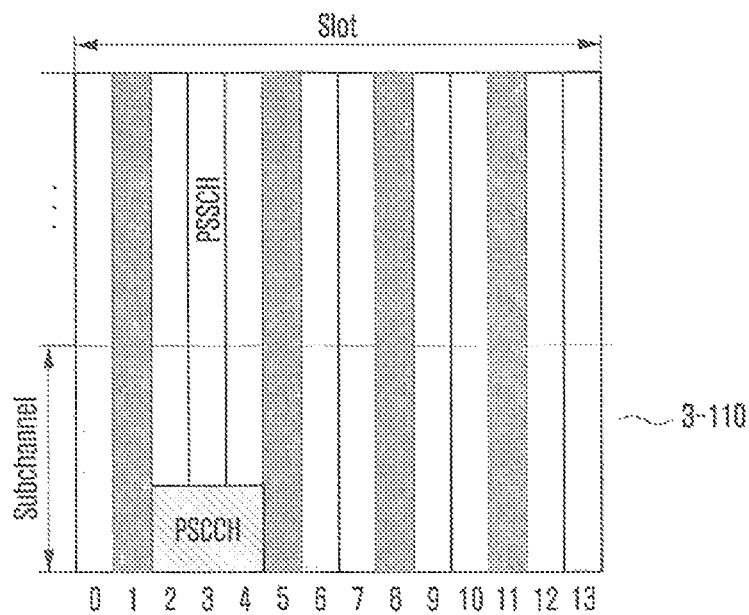
Figure 3E:
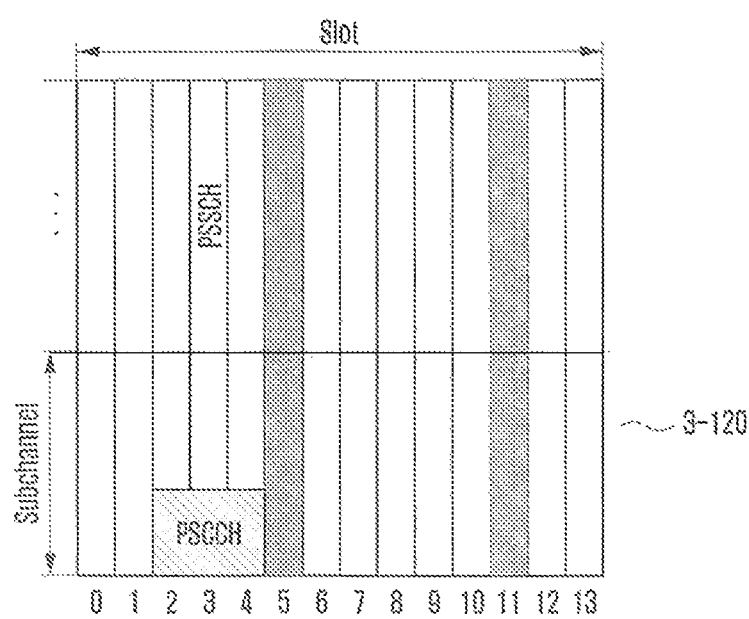

Finally, for the alternative 3, if the PSCCH is positioned in the third sidelink symbol of the slot, one or two symbol regions for AGC may be considered. First, an example of a PSCCH position for the alternative 3 is shown as 3-110 in FIG. 3E assuming one symbol region for AGC. However, unlike the alternative 2, it can be considered that the PSSCH may be transmitted in the first sidelink symbol and the PSSCH DMRS may be transmitted in the second sidelink symbol. The reason why the PSSCH DMRS is considered to be transmitted in the second sidelink symbol as shown 3-110 in FIG. 3E is because the PSSCH is transmitted in the first sidelink symbol and thus, the channel estimation performance may be degraded when the PSSCH DMRS is located behind the PSCCH symbol in time in a case where the channel changes rapidly over time. However, in the alternative 3, the following condition may be considered as a condition that the PSSCH DMRS is transmitted in the second sidelink symbol.

[Conditions that PSSCH DMRS is Transmitted in Second Sidelink Symbol in Alternative 3]

Condition 1: UE speed (absolute speed of TX UE or relative speed between TX/RX UEs) is greater than or equal to A Condition 2: configured number of DMRS symbols is greater than or equal to B Condition 3: number of subchannels allocated by PSSCH is greater than or equal to C Specifically, the PSSCH DMRS may be transmitted in the second sidelink symbol only when one or more of the above conditions are satisfied. Otherwise, the PSSCH DMRS is transmitted behind the PSCCH region in time as shown 3-120 in FIG. 3E. In the case of 3-120 in FIG. 3E, two symbol regions for AGC may be considered.

In the above-described embodiments, a component included in the disclosure is expressed in the singular or the plural according to a presented detailed embodiment. However, the singular form or plural form is selected for convenience of description suitable for the presented situation, and various embodiments of the disclosure are not limited to a single element or multiple elements thereof. Further, either multiple elements expressed in the description may be configured into a single element or a single element in the description may be configured into multiple elements. Additionally, an element expressed in a plural form may be configured in singular, or an element expressed in a singular form may be configured in plural.

On the other hand, in the drawings illustrating the method of the disclosure, the order of description does not necessarily correspond to the order of execution, and the preceding and subsequent relationships may be changed or executed in parallel.

Alternatively, the drawings illustrating the method of the disclosure may include some additional components and/or omit some of components within the scope of not impairing the nature of the disclosure.

While the present disclosure has been particularly shown and described with reference to certain embodiments thereof, it will be understood by those of ordinary skill in the art that various changes in form and details may be made therein without departing from the spirit and scope of the disclosure as defined by the appended claims and their equivalents.

What is claimed is:

1. A method by a first terminal in a wireless communication system, the method comprising:

determining whether to transmit a preamble for an automatic gain control (AGC) based on a subcarrier spacing;

determining a slot and at least one symbol in the slot to transmit the preamble for the AGC, in case that it is determined to transmit the preamble for the AGC; and transmitting, to a second terminal, the preamble for the AGC in the determined slot and at least one symbol in the slot, wherein the slot is a previous slot of a slot to which a signal for the second terminal is transmitted, and the at least one symbol includes a last symbol or a last two symbols of the previous slot, and wherein a length of the at least one symbol is determined based on the subcarrier spacing for the slot.

2. The method of claim 1, further comprising:
detecting an energy for a preamble transmitted from a third terminal;
determining whether a channel is occupied by the third terminal based on the detection; and
determining whether to transmit the preamble for the AGC based on the determination of whether the channel is occupied by the third terminal.

3. A method by a second terminal in a wireless communication system, the method comprising:
determining whether to receive a preamble for an automatic gain control (AGC) based on a subcarrier spacing;
monitoring a slot and at least one symbol in the slot to receive the preamble for the AGC, in case that it is determined to receive the preamble for the AGC; and
receiving, to a first terminal, the preamble for the AGC in the slot and the at least one symbol in the slot,
wherein the slot and the at least one symbol in the slot to receive the preamble for AGC is determined by the first terminal, in case that it is determined by the first terminal to transmit the preamble for the AGC,
wherein the slot is a previous slot of a slot to which a signal for the second terminal is transmitted, and the at least one symbol includes a last symbol or a last two symbols of the previous slot, and
wherein a length of the at least one symbol is determined based on the subcarrier spacing for the slot.

4. The method of claim 3,
wherein the first terminal detects an energy for a preamble transmitted from a third terminal, determines whether a channel is occupied by the third terminal based on the detection, and determines whether to transmit the preamble for the AGC based on the determination of whether the channel is occupied by the third terminal.

5. A first terminal in a wireless communication system, the first terminal comprising:
a transceiver configured to communicate with other network entities; and
a controller configured to:
determine whether to transmit a preamble for an automatic gain control (AGC) based on a subcarrier spacing,
determine a slot and at least one symbol in the slot to transmit the preamble for AGC, in case that it is determined to transmit the preamble for the AGC, and
transmit, to a second terminal, the preamble for the AGC in the determined slot and at least one symbol in the slot,
wherein the slot is a previous slot of a slot to which a signal for the second terminal is transmitted, and the at least one symbol includes a last symbol or a last two symbols of the previous slot, and
wherein a length of the at least one symbol is determined based on the subcarrier spacing for the slot.

6. The first terminal of claim 5, wherein the controller is further configured to:
detect an energy for a preamble transmitted from a third terminal,
determine whether a channel is occupied by the third terminal based on the detection, wherein the length of the at least one symbol is determined based on the subcarrier spacing for the slot of whether the channel is occupied by the third terminal, and
determine whether to transmit the preamble for the AGC based on the determination.

7. A second terminal in a wireless communication system, the second terminal comprising:
a transceiver configured to communicate with other network entities; and
a controller configured to:
determine whether to receive a preamble for an automatic gain control (AGC) based on a subcarrier spacing,
monitor a slot and at least one symbol in the slot to receive the preamble for AGC, in case that it is determined to receive the preamble for the AGC, and
receive, to a first terminal, the preamble for the AGC in the slot and the at least one symbol in the slot,
wherein the slot and the at least one symbol in the slot to receive the preamble for AGC is determined by the first terminal, in case that it is determined by the first terminal to transmit the preamble for the AGC,
wherein the slot is a previous slot of a slot to which a signal for the second terminal is transmitted, and the at least one symbol includes a last symbol or a last two symbols of the previous slot, and
wherein a length of the at least one symbol is determined based on the subcarrier spacing for the slot.

8. The second terminal of claim 7,
wherein the first terminal detects an energy for a preamble transmitted from a third terminal, determines whether a channel is occupied by the third terminal based on the detection of whether the channel is occupied by the third terminal, and determines whether to transmit the preamble for the AGC based on the determination.

* * * * *